United States Patent
Kurihara

(10) Patent No.: US 9,564,935 B2
(45) Date of Patent: Feb. 7, 2017

(54) LINEAR COMPOSITE TRANSMITTER UTILIZING COMPOSITE POWER AMPLIFICATION

(71) Applicant: FODAN CO. LTD., Tokyo (JP)

(72) Inventor: Hiroshi Kurihara, Tokyo (JP)

(73) Assignee: FODAN CO. LTD., Tokyo (JP)

(*) Notice: Subject to any disclaimer, the term of this patent is extended or adjusted under 35 U.S.C. 154(b) by 0 days.

(21) Appl. No.: 14/901,037

(22) PCT Filed: Jun. 27, 2014

(86) PCT No.: PCT/JP2014/067993
§ 371 (c)(1),
(2) Date: Dec. 27, 2015

(87) PCT Pub. No.: WO2014/208779
PCT Pub. Date: Dec. 31, 2014

(65) Prior Publication Data
US 2016/0164553 A1    Jun. 9, 2016

(30) Foreign Application Priority Data

Jun. 27, 2013  (JP) ................................. 2013-147983

(51) Int. Cl.
*H04K 1/02*    (2006.01)
*H04L 25/03*   (2006.01)
(Continued)

(52) U.S. Cl.
CPC .......... *H04B 1/0475* (2013.01); *H03F 1/0288* (2013.01); *H03F 1/0294* (2013.01);
(Continued)

(58) Field of Classification Search
CPC ........ H03F 1/3247; H03F 3/24; H03F 1/3241; H04L 27/368; H03G 3/3042
(Continued)

(56) References Cited

U.S. PATENT DOCUMENTS 5,264,807 A * 11/1993 Okubo ...................... H03F 1/02
330/124 R
5,381,153 A *  1/1995 Saito ...................... G01S 13/345
342/109
(Continued)

FOREIGN PATENT DOCUMENTS

JP  2003536312 A  12/2003
JP  2005117599 A   4/2005
WO   02/05421 A1   1/2002

OTHER PUBLICATIONS

International Search Report for application PCT/JP2014/067993 dated Sep. 9, 2014.

*Primary Examiner* — James M Perez
(74) *Attorney, Agent, or Firm* — Roberts Mlotkowski Safran Cole & Calderon PC

(57) ABSTRACT

The present invention provides a compound transmitter having power efficiency characteristics and distortion characteristics superior, over a wide band, to those of a Doherty transmitter, and having fewer elements constituting an RF circuit. The present invention is therefore provided with a compound amplifier (201) for generating a signal (z) (efficiency improving signal) obtained by the amplitude modulation of a carrier signal from an RF modulation signal (a) (main signal); power-modulating, using two power amplifiers (50, 51), a signal (S1) obtained by adding together (a) and (z), and a signal (S2) obtained by subtracting (z) from (a); and setting, as a transmitter output point, the point (p1) where the respective outputs are combined via impedance inverters (60, 61), the efficiency improving signal (z) being generated under conditions in which the size of the envelope of either (S1) or (S2) is fixed.

11 Claims, 10 Drawing Sheets

(51) Int. Cl.
*H04L 25/49* (2006.01)
*H04B 1/04* (2006.01)
*H03F 1/02* (2006.01)
*H03F 3/189* (2006.01)
*H03F 3/24* (2006.01)
*H03F 3/19* (2006.01)
*H03F 3/21* (2006.01)

(52) U.S. Cl.
CPC ............ *H03F 3/189* (2013.01); *H03F 3/19* (2013.01); *H03F 3/211* (2013.01); *H03F 3/245* (2013.01); *H03F 2200/102* (2013.01); *H03F 2200/204* (2013.01); *H03F 2200/207* (2013.01); *H03F 2200/336* (2013.01); *H03F 2200/451* (2013.01); *H03F 2203/21106* (2013.01); *H03F 2203/21142* (2013.01); *H04B 2001/045* (2013.01)

(58) Field of Classification Search
USPC .................................................. 375/295–297
See application file for complete search history.

(56) References Cited

U.S. PATENT DOCUMENTS

| | | | | |
|---|---|---|---|---|
| 6,285,251 B1* | 9/2001 | Dent | ............ | H02M 3/1582 330/124 R |
| 6,311,046 B1* | 10/2001 | Dent | ............ | H03F 1/0205 455/102 |
| 6,697,436 B2* | 2/2004 | Wright | ............ | G01N 27/4163 330/106 |
| 6,751,265 B1* | 6/2004 | Schell | ............ | H03C 1/50 375/269 |
| 6,798,843 B1* | 9/2004 | Wright | ............ | H03F 1/3241 330/149 |
| 7,515,652 B2* | 4/2009 | Jensen | ............ | H04L 27/2003 375/135 |
| 7,657,238 B2* | 2/2010 | Grange | ............ | H03F 3/24 375/297 |
| 7,733,978 B2* | 6/2010 | Lin | ............ | H03F 1/3247 375/232 |
| 8,031,804 B2* | 10/2011 | Sorrells | ............ | H03F 1/0205 375/229 |
| 8,081,935 B2* | 12/2011 | Liang | ............ | H04B 1/0483 375/297 |
| 8,384,476 B2* | 2/2013 | Draxler | ............ | H03F 1/3247 330/149 |
| 8,660,208 B2* | 2/2014 | Brillant | ............ | H04L 27/36 329/304 |
| 8,670,732 B2* | 3/2014 | Borodulin | ............ | H03F 1/0277 375/297 |
| 8,824,594 B2* | 9/2014 | Mahoney | ............ | H04L 25/03343 375/296 |
| 8,942,652 B2* | 1/2015 | Khlat | ............ | H03F 1/0227 330/200 |
| 8,964,716 B2* | 2/2015 | Jones | ............ | H03G 3/3042 370/252 |
| 8,964,821 B2* | 2/2015 | Coan | ............ | H03F 1/3247 375/219 |
| 9,240,761 B1* | 1/2016 | Reyland, Jr. | ............ | H03F 1/0294 |
| 2003/0076166 A1* | 4/2003 | Hellberg | ............ | H03F 1/0288 330/124 R |
| 2003/0198300 A1* | 10/2003 | Matero | ............ | H04L 27/368 375/297 |
| 2005/0152469 A1* | 7/2005 | Fusco | ............ | H04L 27/36 375/295 |
| 2006/0099919 A1* | 5/2006 | Sorrells | ............ | H03C 5/00 455/127.1 |
| 2008/0002764 A1* | 1/2008 | Luu | ............ | H03C 1/36 375/239 |
| 2008/0068078 A1* | 3/2008 | Iwasaki | ............ | H03F 1/0261 330/124 R |
| 2008/0191801 A1* | 8/2008 | Kim | ............ | H03F 1/0288 330/124 R |
| 2009/0180530 A1* | 7/2009 | Ahn | ............ | H03F 1/0266 375/238 |
| 2010/0158155 A1* | 6/2010 | Borkar | ............ | H03F 1/3247 375/297 |
| 2010/0225390 A1* | 9/2010 | Brown | ............ | H03F 1/26 330/149 |
| 2011/0051842 A1* | 3/2011 | van der Heijden | ... | H03F 1/0294 375/295 |
| 2012/0105147 A1* | 5/2012 | Harris | ............ | H03F 1/56 330/57 |
| 2012/0155572 A1* | 6/2012 | Kim | ............ | H03F 1/3247 375/297 |
| 2013/0016795 A1* | 1/2013 | Kunihiro | ............ | H03F 1/0288 375/295 |
| 2013/0148760 A1* | 6/2013 | Hezar | ............ | H03F 3/211 375/297 |
| 2014/0118063 A1* | 5/2014 | Briffa | ............ | H03F 1/32 330/124 R |
| 2015/0103952 A1* | 4/2015 | Wang | ............ | H04L 27/368 375/297 |
| 2015/0188504 A1* | 7/2015 | Kesson | ............ | H03F 1/0288 330/286 |
| 2015/0195118 A1* | 7/2015 | Yan | ............ | H04B 1/0475 375/297 |
| 2015/0263678 A1* | 9/2015 | Kunihiro | ............ | H03F 3/24 330/295 |

* cited by examiner

Fig. 10
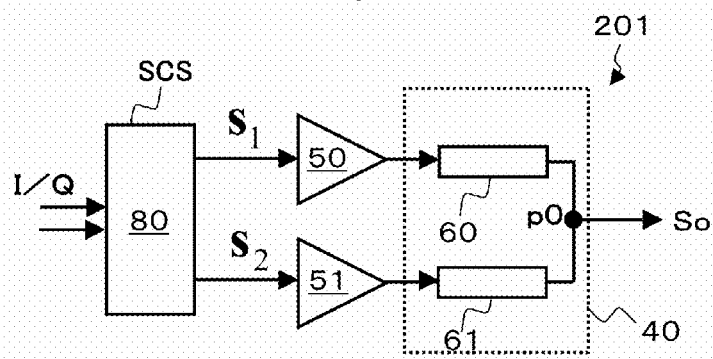
Fig. 11(a)                    Fig. 11(b)
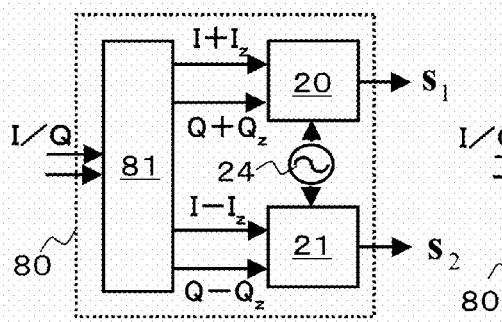 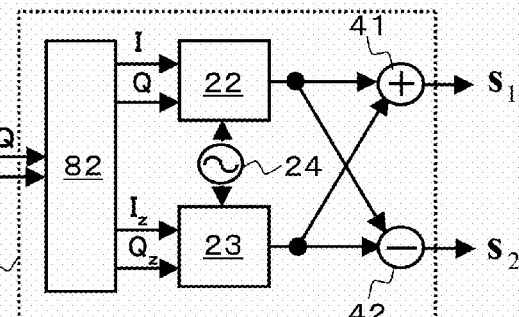
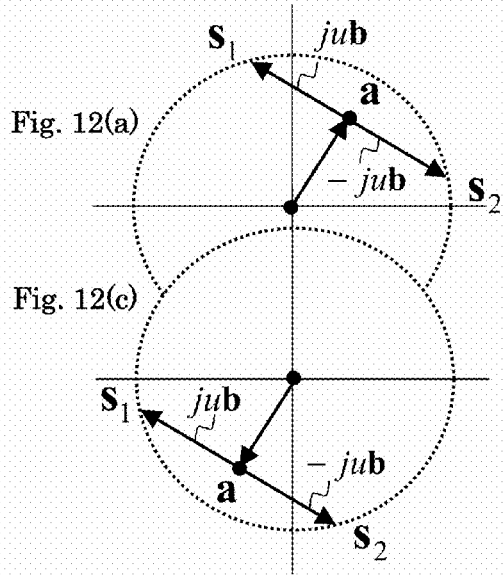 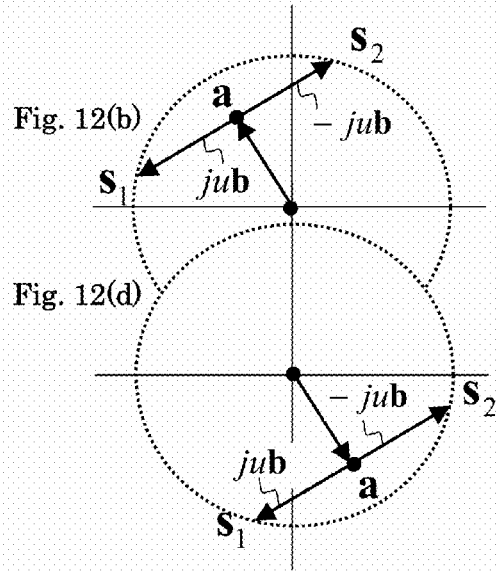
Fig. 12(a)    Fig. 12(b)
Fig. 12(c)    Fig. 12(d)

LINEAR COMPOSITE TRANSMITTER UTILIZING COMPOSITE POWER AMPLIFICATION

FIELD OF THE INVENTION

This invention relates to a power amplifier and a transmitter for use in a base station and with terminals of a mobile wireless communication system (e.g. micro-wave mobile phones), a satellite communication system, and a broadcasting system.

More particularly, the invention relates to a composite power amplifier for linear amplification of an RF modulated signal, e.g. a multi-carrier signal having a large peak envelope power as compared with its average output power. The inventive composite transmitter is simpler in structure than conventional ones, yet it has an improved linearity and power efficiency characteristics.

BACKGROUND ART

The present invention pertains to an improvement of a composite power amplifier such as a Chireix power amplifier (See Non-patent Document 1) and a Doherty power amplifier (Non-patent document 2), the improvement directed to remove a disadvantageous narrow band characteristic of such composite power amplifier. The Chireix power amplifier was invented by Chireix in 1935, and the Doherty power amplifier was invented by Doherty in 1936. Both of them have been used as AM broadcasting transmitters. Before semiconductors were invented, their power amplifying elements were vacuum tubes. However, after semiconductor amplifiers were invented, they were widely used as final-stage amplifiers, especially in mobile, satellite, and broadcasting systems. The Chireix amplifiers are often called LINC power amplifiers (Non-patent Reference 3).

In the Chireix amplifiers and the Doherty amplifier (hereinafter referred to as composite amplifiers), the ratio between an output voltage and an output current, known as equivalent load impedance, is varied in accordance with the magnitude of an input signal, thereby increasing the power efficiency of an amplifier. This makes their amplification behaviors extremely complex, so that it is difficult to maintain a high power efficiency and a linearity over a wide frequency band.

An operational principle and a power efficiency characteristic of an prior art composite power amplifier will now be given below with reference to the Chireix amplifier first and then to the Doherty amplifier.

As shown in FIG. 1, a Chireix transmitter 101 equipped with the Chireix power amplifier comprises;

(1) a signal component separating device 190 which, upon receipt of an in-phase component I(t) of a baseband signal (the in-phase component I(t) hereinafter referred to as in-phase signal I(t)) and an orthogonal component Q(t) of the baseband signal (the orthogonal component hereinafter referred to as orthogonal signal Q(t)), generates an RF modulated signal A (hereinafter referred to a main signal A), obtained by orthogonal modulation of I(t) and Q(t) (Eq. 1 below), a signal B orthogonal to the main signal A (the orthogonal signal B hereinafter referred to as efficiency improving signal EIS B), and a first composite signal S1 in the form of a vectorial sum of the main signal A and the EIS B, and a second composite signal S2 in the form of a vectorial difference between the main signal A and the EIS B;

(2) power amplifiers 150 and 151 for power amplifying the respective composite signals S1 and S2; and (3) a Chireix power combiner 140 for combining the outputs of the power amplifiers 150 and 151 to provide the output signal $S_0$ of the Chireix transmitter 101.

The Chireix network 140 consists of two impedance inverters (or ¼-wavelength lines) 160 and 161 each adapted to interface its input terminals and its output terminal; and two reactance elements 170 and 171 each adapted to interface its respective input terminals and the ground. The reactances of the two reactance elements have the same absolute value, but have opposite signs. It is noted that the term "efficiency improving signal (EIS)" is not a common technical term but is a term named by the present inventor to connote an implication of the signal that it enhances the power efficiencies of the power amplifiers. This term will be used in this context in an exposition below of the prior art Doherty transmitter and in the description of the present invention as well.

The main signal A is a high-frequency modulated signal (or RF modulated signal) obtained by an orthogonal modulation of an in-phase component of a baseband signal (hereinafter referred to as in-phase baseband signal) I(t) and an orthogonal component of the baseband signal (hereinafter referred to as orthogonal baseband signal) Q(t) with a carrier angular frequency $\omega_0$. Thus, the main signal A is given by the following equation.

$$A(t)=I(t)\cos(\omega_0 t)+Q(t)\sin(\omega_0 t) \qquad (Eq.\ 1)$$

In terms of an envelope signal a(t) and a phase modulation signal $\phi(t)$, the main signal A and its vectorial form a can be written in the following forms.

$$A(t)=a(t)\cos\{\omega_0 t+\phi(t)\} \qquad (Eq.\ 2)$$

$$a=a(t)\exp\{j\omega(t)\} \qquad (Eq.\ 3)$$

An EIS B, which is orthogonal to the main signal A, satisfies a condition that the envelope of the composite signal of the main signal A and the EIS B equals the peak envelope level C (which is often referred to as peak level C or simply C) of the main signal A. From this condition, the EIS B is given by the following equation.

$$B(t)=-b(t)\sin\{\omega_0 t+\phi(t)\} \qquad (Eq.\ 4)$$

where $b(t)=\sqrt{C^2-a(t)^2}$ and C is the peak level of the main signal.

The power amplifiers 150 receives the first input signal S1 which is a vectorial sum of the EIS B (for which a vector representation is jb) and the main signal A, while the power amplifier 151 receives the second input signal S2 which is a vectorial difference between the main signal A and the EIS B, as given by the following Equations.

$$S1(t)=A(t)+B(t) \qquad (Eq.\ 5)$$

$$S2(t)=A(t)-B(t) \qquad (Eq.\ 6)$$

Plugging Eq. 2 and Eq. 4 in Eq. 5 and Eq. 6, respectively, S1(t) and S2(t) turn out to be $$S1(t)=C\cos[\omega_0 t+\phi(t)+\cos^{-1}\{a(t)/C\}] \qquad (Eq.\ 7)$$

$$S2(t)=C\cos[\omega_0 t+\phi(t)-\cos^{-1}\{a(t)/C\}] \qquad (Eq\ 8)$$

Eq. 7 and Eq. 8 show respectively that the envelope levels of the first and the second composite signals S1 and S2, respectively, are constant (equal to the peak level C of the main signal) and that they are either advanced or delayed in phase relative to the main signal by $\cos^{-1}\{a(t)/C\}$.

Since in the Chireix transmitter 101 the envelope levels of the input signals fed to the power amplifiers 150 and 151 are always equalized to the peak level C of the main signal by adding the EIS B to the main signal A, the power amplifiers 150 and 151 always operate at their maximum power efficiencies. The EISs B fed to the input ends of the power amplifiers 150 and 151 are cancelled out at the output end of the Chireix power combiner 140, resulting in an output signal $S_0$ given by the following Eq. 9.

$$S_0(t)=g\{S1(t)+S2(t)\}/\sqrt{2}=\sqrt{2}gA(t) \quad \text{(Eq. 9)}$$

where g is the voltage gain of the power amplifiers 150 and 151.

Focusing attention to the power amplifier 150, it appears that, because of the power amplifier 151 in operation, an equivalent output impedance (i.e. the ratio between the output voltage and the output current) of the power amplifier 150 turns out to be a non-real number. In other words, it appears that an element of reactance Xc is connected between the output end of the power amplifier 150 and the ground. In order to achieve an impedance matching with the power amplifier 151, it suffices to connect an reactance element 170 of reactance −Xc between the output end of the power amplifier 150 and the ground. In this case, however, the magnitude of Xc changes with the envelope level a(t) of the main signal A, so that the impedance matching can be achieved only when the main signal A has certain particular magnitudes. Referring to FIG. 2, there is shown a power efficiency characteristic (curve c21) of the Chireix transmitter 101, in which the abscissa represents the normalized input voltage of the main signal A and the ordinate the power efficiency. It is shown in the figure by curve c21 that the power amplifier 150 has a maximum power efficiency $\eta_0$ only when $a=a_1$ and $a=a_2$ where a is the normalized input voltage of the main signal A, but has a power efficiency less than $\eta_0$ otherwise (especially when $a<a_1$) (Non-patent Document 4). It should be noted that curve c21 represents a case where the power amplifiers 150 and 151 are assumed to be B-class amplifiers and Xc is chosen to maximize the power efficiency of the Chirex transmitter 101 at $a_1=\frac{1}{3}$. Curve c20 shows a power efficiency of the B-class amplifier. One way to improve the power efficiency of the Chireix transmitter 101 is to construct the transmitter in a power recycling configuration (Non-patent Document 5). FIG. 3 shows a power recycling type Chireix transmitter 102, in which, unlike the Chireix transmitter 101, the main signal A and the EIS B of the outputs of the power amplifiers 150 and 151 are extracted independently by means of a 180-degree hybrid circuit 141, and the power of the extracted EIS B is converted into a DC power by a high-frequency-DC converter circuit 172 and recycled to power supply terminals Vs of the power amplifiers 150 and 151. If the high-frequency-DC converter circuit 172 had 100% power conversion efficiency, then the power efficiency of the Chireix transmitter 102 would be always equal to $\eta_0$ irrespective of the input voltage of the main signal A, as shown in FIG. 2 by line c22. Unfortunately, it is extremely difficult in practice to have a power efficiency of the Chireix transmitter 102 exceeding the efficient of the Chireix transmitter 101 by enhancing the power conversion efficiency of the high frequency-DC converter circuit 172. Therefore, so far as the present inventor knows, the Chireix transmitter 102 has not been in actual practice, though its value has been studied in some academic fields.

Next, a Doherty transmitter 103 will now be discussed, which is one of variable-load impedance type composite transmitters equally well known as the Chireix transmitter. Referring to FIG. 4(a), there is shown a Doherty transmitter 103, which comprises:

(1) an orthogonal modulator 90 which, upon receipt of an in-phase baseband signal I(t) and an orthogonal baseband signal Q(t), outputs a main signal A obtained by orthogonal modulation of the two input signals;

(2) a power amplifier 152 for power amplifying the main signal A fed thereto;

(3) a power amplifier 153 for power amplifying the main signal A fed thereto after the main signal A is delayed by means of a ¼-wavelength line 163; and (4) a Doherty power combiner 142 for combining the outputs of the power amplifiers 152 and 153 via an impedance inverter 162 to thereby provide a transmission output signal $S_0$.

In the Doherty transmitter 103, the power amplifier 152 is called a carrier amplifier (CA), which is in practice either B- or AB-class amplifier. The power amplifier 153, which is also called peaking amplifier (PA), is a C-class CA. Each of the CA and the PA receives a bifurcated and power-amplified main signal A. The Doherty transmitter 103 can be represented by an ideal current source model as shown in FIG. 4(b), assuming that the ¼-wavelength line functions as an ideal impedance inverter 162 and that the CA and the PA are both ideal current sources. FIG. 5(a) shows a normalized output voltage (characteristic curve c50) of the CA as a function of the normalized input voltage of the main signal, along with a normalized output voltage of the PA (characteristic curve c51). FIG. 5(b) shows normalized output current characteristics of the CA and PA (curves c52 and c53) as functions of the normalized input voltage of the main-signal.

Operations of the Doherty transmitter 103 may be discussed in two separate domains, one in a small power domain (where the envelope level is not more than ½ of the peak vale C of the signal) and in a large power domain (where the envelope level of the main signal exceeds ½ of the peak level.) Referring to curve c50 shown in FIG. 5(a) and curve c53 shown in FIG. 5(b), it is seen that the CA operates but the PA is cut off in the small power domain, so that the PA can be regarded as an open circuit. Consequently, if the loaded impedance of the CA (assumed to be a B-class amplifier) is 50Ω, it operates as an ordinary B-class amplifier, supplying power to a 100Ω load. Its instantaneous power efficiency increases with the output voltage, and reaches its 78.5% efficiency at the normalized main signal voltage of 0.5.

As the voltage of the main signal exceeds one half the peak envelope level C, the PA begins to operate, causing a further current to be supplied from the PA to the Doherty transmitter 103, thereby reducing its apparent load impedance. As the CA remains saturated at a saturation point, maintaining a constant voltage, the CA can be regarded as a constant-voltage power source that operates at its maximum power efficiency. When outputting a peak envelope power (PEP), the CA and the PA can see a load of 50Ω, each providing its power as much as ½ of the maximum output power, and then the theoretical PEP efficiency of the CA is 78.5% if the CA is a B-class amplifier (Non-patent Document 6).

It has been disclosed in a literature (Non-patent Document 6) that when the Doherty transmitter 103 shown in FIG. 4(b) is represented by an ideal current source, its power efficiency is represented by curve c60 shown in FIG. 6 (to be compared with curve c61 representing the power efficiency of a B-class amplifier). In actuality, however, it is difficult to make the Doherty transmitter 103 operable over a wide frequency domain due to the fact that in a domain away from its central frequency fc its power efficiency drops and causes its output signal distorted, although the ¼-wavelength line 162 acts as an ideal impedance inverter at the central frequency fc (Patent Document 1).

In recent years, it has been proposed in Non-patent Document 6 (FIG. 7(a)) to amplitude modulate the main signal A in such a way that the input voltage vs output current characteristic of the power amplifier 152 becomes identical to the input voltage vs output power characteristic of the CA used in the Doherty transmitter 103 and the input voltage vs output current characteristic of the power amplifier 153 becomes identical to the input voltage vs output power characteristic of the PA utilized in the Doherty transmitter 103 when the power amplifiers 152 and 153 are of B-class or AB-class amplifiers.

A merit of the Doherty transmitter 104 lies in the fact that the input power fed to the power amplifiers 152 and 153 can be reduced as compared with the Doherty transmitter 103, which helps increase the power add efficiency of the Doherty transmitter 104, and that the same B- or AB-class amplifiers can be used as the two power amplifiers 152 and 153, which permits reduction of its manufacturing cost and extension of operable frequency band, as disclosed in the Patent Document 1.

The EIS to be added to the main signal A of the Doherty transmitter 104 will be referred to as EIS A1, as in the Chireix transmitter 101. By writing the main signal A in the form of Eq. 1 and Eq. 2 as in the Chireix transmitter 101, the EIS A1 is given by $$A1(t) = a(t)\cos\{\omega_0 t + \varphi(t)\} \quad (0 \le a(t) \le C/2) \quad \text{(Eq. 10)}$$
$$= \{C - a(t)\}\cos\{\omega_0 t + \varphi(t)\} \quad (C/2 \le a(t) \le C)$$

The first composite signal S1(t) fed to the power amplifier 152 is a vectorial sum of the main signal A and the EIS A1, while the second composite signal S2(t) fed to the power amplifier 153 is a vectorial difference between the main signal A and the EIS A1, which are give by the following equations, respectively $$S1(t) = A(t) + A1(t) \quad \text{(Eq. 11)}$$
$$= 2a(t)\cos\{\omega_0 t + \varphi(t)\} \quad (0 \le a(t) \le C/2)$$
$$= C\cos\{\omega_0 t + \varphi(t)\} \quad (C/2 \le a(t) \le C)$$
$$S2(t) = A(t) - A1(t) \quad \text{(Eq. 12)}$$
$$= 0 \quad (0 \le a(t) \le C/2)$$
$$= \{2a(t) - C\}\cos\{\omega_0 t + \varphi(t)\} \quad (C/2 \le a(t) \le C)$$

Patent Document 1 proposes to replace, by an alternative Doherty transmitter 105 (not shown), a circuit of the Doherty transmitter 104 that generates a first and a second composite signals S1 and S2, respectively, from a main signal. The Doherty transmitter 105 generates the second composite signals S2 by passing the main signal A through a nonlinear circuit (nonlinear emulator 181), and then generates the first composite signal S1 by passing S2 through a cross combining filter 182 and subtracting the resultant signal from the main signal A.

In a conventional Doherty transmitter 103, the input vs output voltage characteristic of the CA for inputted main signal is not constant in a large-power domain, while the input vs output voltage characteristic of the PA lacks linearity in a small-power domain, as shown in FIG. 8(a) by curves c80 and c81, respectively. On the other hand, in an attempt to broaden such linearity domain, Patent Document 1 discloses a method of simulating ideal input-output voltage characteristics of the CA and PA for a main signal as shown in FIG. 8(b) (curves C82 and C83) by optimization of a cross coupling filter 182.

In any of conventional composite transmitters discussed above, a usable frequency bandwidth of the EIS is limited by a limitative operational speed of a digital signal processing circuit used. Furthermore, in actuality the first nor the second power amplifiers can never be a perfect linear amplifier, outputting nonlinear distorted components even outside the limited frequency band of the EIS.

This phenomenon is called "spectral regrowth", which will be now described with reference to Fig. (a)-(b) for a case where the first and the second power amplifiers are of AB-class (having a gate bias voltage 0.2 times that of an A-class amplifier), and a main signal is an standard RF modulated signal (or 4-wave QPSK signal, as defined and used in the first embodiment below).

FIG. 9(a) shows power spectral densities (PSDs) of the EIS (curve c91) and of the output signal (curve c92) of the Chireix transmitter 101, showing spectral regrowths outside the normalized frequency band (−1.5 through +1.5).

FIG. 9(b) shows power spectral densities of the EIS (curve c94) and of the output signal (curve c94) of the Doherty transmitter 104, showing spectral regrowths outside the normalized frequency band (−1.5 through +1.5). In view of the fact that a spectral regrowth density decreases as the PSD decreases at a frequency band edge of the EIS, it is an important issue for a composite transmitter to narrow its EIS bandwidth for an improvement of the ACLR characteristic of the composite transmitter.

PRIOR ART DOCUMENTS

Patent Documents

Patent Document 1:
Hellberg, R, et. al., "Transmitter including a Composite Amplifier," PCT/SE2001/001419

Non-Patent Document

Non-patent Document 1: Chireix, H., "High Power Outphasing Modulation", Proc. IRE, Vol. 23, No. 11, November 1935, pp. 1370-1392
Non-patent Document 2: Doherty, W. H., "A New High Efficiency Power Amplifier for Modulated Waves," Proc. IRE, Vol. 24, No. 9, September 1936, pp. 1163-1182
Non-patent Document 3: Cox, D. C., "Linear Amplification with Nonlinear Components," IEEE Transactions on Communication, December 1974, pp. 1942-1945
Non-patent Document 4: Raab, "Efficiency of cut phasing RF Power-Amplifier Systems," IEEE Transactions on Communications, VoL COM-33, No. 10, October 1985
Non-patent Document 5: Zhang, X., et. al., "Analysis of Power recycling techniques for RF and microwave outphasing Power Amplifiers," Circuits and Systems II: IEEE Transactions on ADSP, Vol. 49, 2012, PPO12-320
Non-patent Document 6: Kenington, P. B., "High Linearity RF Amplifier Design," Artec House, 2010, pp. 493-502

BRIEF SUMMARY OF THE INVENTION

Objects to be Achieved by the Invention

As discussed above, prior art composite amplifiers are so-called variable-impedance amplifiers. That is, the output impedances of its two power amplifiers change with the level of the main signal. Since the structure of a power combiner for combining two outputs of two power amplifiers is relatively complex, there has been a limit to achieve both a good power efficiency and a good PSD characteristic over a wide frequency bandwidth.

It is, therefore, a primary object of the present invention to provide an innovative composite transmitter having a good power efficiency as well as a preferred PSD over a wide range of frequency, by use of a power combiner which has a symmetric structure for combining the outputs of a first and a second power amplifiers, a fixed-impedance structure, and capability of differentiating the frequencies of the EIS and the main signal in setting up an independent impedance for each of a main signal and an EIS (in contrast to a conventional composite transmitter having a variable impedance for a main signal and an EIS).

Means of Achieving the Object

Referring to FIG. 10, there is shown a first composite transmitter 201 according to the invention, comprising the following three components.

(1) A device 80 which, upon receipt of an in-phase component of a baseband modulation signal I(t) (the in-phase component signal hereinafter referred to as in-phase signal I) and an orthogonal component Q(t) of the baseband signal, orthogonal to the in-phase signal I (the orthogonal component hereinafter referred to as orthogonal signal Q), generates
a first composite signal S1 in the form of a vectorial sum of
a main signal obtained by orthogonal modulation of the in-phase signal I and the orthogonal signal Q and
an efficiency improving signal (EIS) obtained by subjecting the main signal to frequency shifting and envelope conversion, and
a second composite signal S2 in the form of a vectorial difference between the main signal and the EIS (the device will be hereinafter referred to simply as signal component separating device 80).

(2) A first power amplifier 50 for power amplifying the first composite signal S1 and a second power amplifier 51 for power amplifying the second composite signal S2, and (3) A power combiner 40 for combining an output of the first power amplifier 50 and an output of the second power amplifier 51 to provide a composite power at its power combining end.

The composite transmitter 201 has a first feature that the signal component separating device is configured to differentiate instantaneous frequencies of the EIS and the main signal by restraining the phase of the EIS within a predetermined range centered about an arbitrarily given phase $\theta_0$. The composite transmitter 201 also has a second feature that a first line length between a first input end and the output end of the power combiner 40 and a second line length between a second input end and the output end of the power combiner 40 are such that each line is equivalent to an open circuit for the EIS when the line is viewed from the respective output ends of the first and second power amplifiers.

In a second aspect of the invention, the compound transmitter 201 is configured in the form of a composite transmitter 202 (not shown) in which the signal component separating device provides:

a phase determination signal u(t) which is +1 if the phase of the main signal is in a range between $\theta_0-\pi/2$ and $\theta_0+\pi/2$ but is −1 otherwise;

an in-phase baseband signal Iz of the EIS in the form of a product of
an envelope conversion signal, which is defined to be a square root of a quantity minus 1 where the quantity equals the square of the peak envelop value C of the main signal divided by the square of the envelope of the main signal,
a signal −Q obtained by multiplying Q by −1; and
the phase determination signal u,
and
an orthogonal baseband signal Qz of the EIS in the form of a product of
the envelope conversion signal,
the in-phase signal I, and
the phase determination signal u.

In a third aspect of the invention, the composite transmitter 201 is modified in the form of a composite transmitter 203 (not shown) in which the signal component separating device provides:

a phase determination signal u(t) which equals +1 if the main signal has a phase in the range between $\theta_0-\pi/2$ and $\theta_0+\pi/2$, but −1 otherwise;
an EIS in the form of a product of
the main signal and
the phase determination signal u,
when the envelope level of the main signal is not more than ½ of the peak envelope C, but, when the envelope level of the main signal falls in a range between C/2 inclusive and C inclusive, EIS in the form of a product of
the phase determination signal u and
a composite signal composed of
a signal obtained from the main signal by shifting it by 180 degrees, and
an envelope signal E obtained from the main signal by replacing its envelope level replaced by its peak envelope level C.

In a fourth aspect of the invention, the composite transmitter 201 is configured in the form of a composite transmitter 204 (not shown) in which,
wherein the signal component separating device provides:
a phase determination signal u(t) which is +1 if the phase of the main signal is in a range between $\theta_0-\pi/2$ and $\theta_0+\pi/2$ but is −1 otherwise;
an EIS in the form of a product of
the phase determination signal u(t),
a signal obtained from an envelope signal E, which is obtained from the main signal by replacing the envelope level of the main signal with the peak envelope level C, by subtracting the main signal from the envelope signal E.

In a fifth aspect of the invention, the composite transmitter 201 is given in the form of a composite transmitter 205 shown FIG. 19, in which
the signal component separating device provides: a signal having a real part I' and an imaginary part Q' obtained from the main signal by shifting it by an arbitrary phase $\theta_1$ in the negative direction;

an EIS having a phase equal to $\theta_1$ and an envelope level z, where z is given by the square root of a first quantity minus a second quantity; the first quantity is given by the square of the peak envelope level C of the main signal minus the square of the imaginary part Q'; and the second quantity is given by the absolute value of the real part I'.

In a sixth aspect of the invention, the composite transmitter 201 is configured in the form of a composite transmitter 206 (not shown), wherein the signal component separating device provides the EIS such that the following conditions are satisfied:

given a real number d between 0 and 1, a normalized envelope level x (which is defined to be the envelope level of the main signal divided by the peak envelope level C) falls within a range from ½−d/2 to ½+d/2, or within a sub-range of the range, a normalized envelope level of the second composite signal, obtained therefrom by dividing its envelope level by the peak envelope level C of the main signal, is set to d when the normalized envelope level of the first composite signal, obtained therefrom by dividing its envelope level by the peak envelope level C, is equal to 1, or the normalized envelope level of the first composite signal is set to d when the normalized envelope level of the second composite signal is equal to 1.

In a seventh aspect of the invention, an inventive composite transmitter 207 shown FIG. 29 is constructed according to any one of the composite transmitters 201 through 206. The composite transmitter 207 is structured to provide a distorted signal by:

receiving a part of its output, cancelling out therefrom the main signal, and orthogonally demodulating a resultant signal, or receiving and orthogonally demodulating a part of the output and canceling out an in-phase signal I and/or an orthogonal signal Q of the main signal from the orthogonally demodulated signal; construct a gain control signal from the distorted signal by suppressing fluctuations of the envelope of the main signal, controls gain(s) of a first line between the input end of the signal component separating device and the output end of the transmitter via the first power amplifier and/or a second line between the input end of the input end of the signal component separating device and the output end of the transmitter via the second power amplifier, by means of the gain control signal, whereby reducing ACLR contained in the output signal of the transmitter to a predetermined level.

Merits of the Invention

It is noted that the composite transmitter 201 differentiates the frequencies of a main signal and an efficiency improving signal (EIS) and that the power combiner 40 is structured in a symmetrical configuration to combine the powers of the two power amplifiers 50 and 51, so that output impedances of the main signal and the efficiency improving signal can be set up independently. As a result, the composite transmitter 201 enables operations of the two power amplifiers 50 and 51 with nearly the maximum power efficiency over a wide range of frequency and a wide range of input signal level, in contrast to the Chireix transmitters 101 and the Doherty transmitters 103 which can maximize their power efficiencies only at center frequencies and limited levels for a given input signal.

BRIEF DESCRIPTIONS OF THE DRAWINGS

Figure 5A:
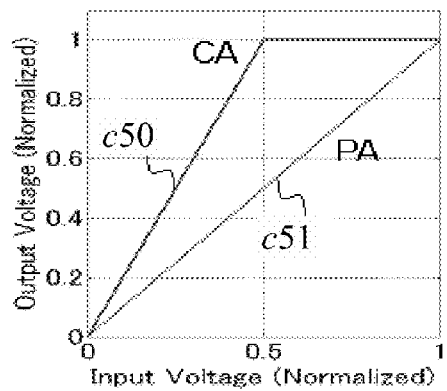
Figure 5B:
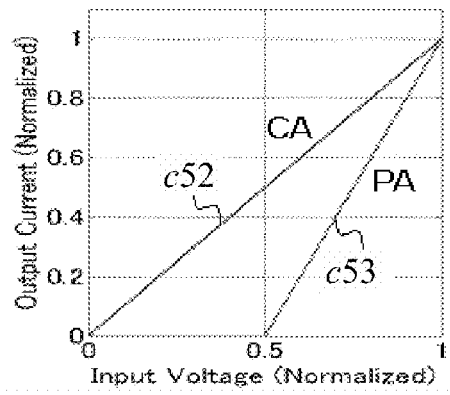
Figure 6:
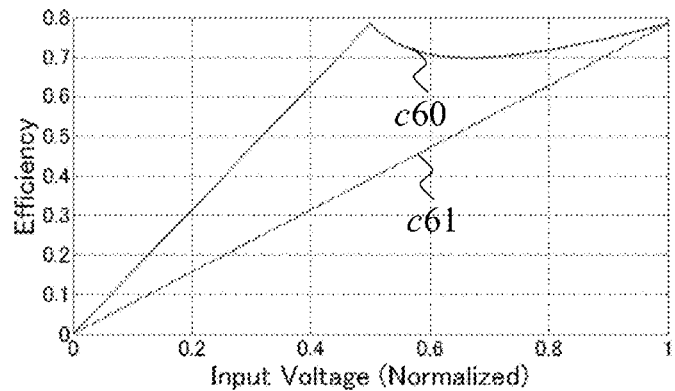

FIG. 5(*a*) shows a normalized output voltage characteristics of the power amplifiers 152 and 153 of the Doherty transmitter 103 as functions of normalized input voltage of a main signal;

FIG. 6 shows a power efficiency characteristic of the conventional Doherty transmitter 103.

Figure 7A:
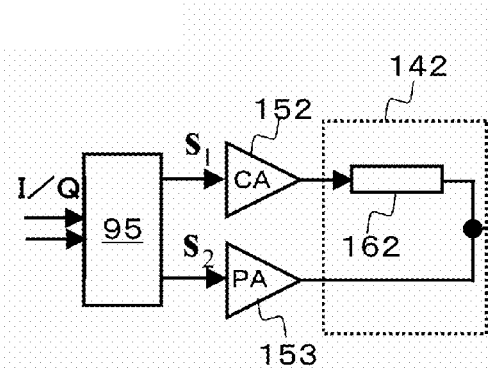
Figure 7B:
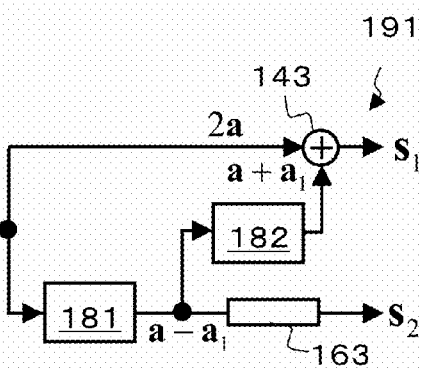

FIG. 7(*a*) shows a configuration of the Doherty transmitter 104 which is an improved version of the Doherty transmitter 103, and FIG. 7(*b*) shows a circuit for generating, from a given input signal, signals S1 and S2 to be fed to the power amplifiers 152 and 153, respectively, so as to remove non-linear components that appear in the output end of the transmitter.

Figure 8A:
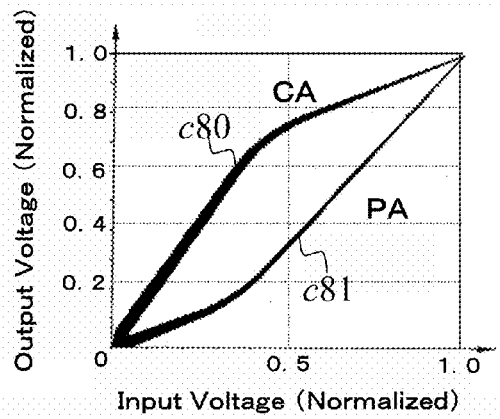
Figure 8B:
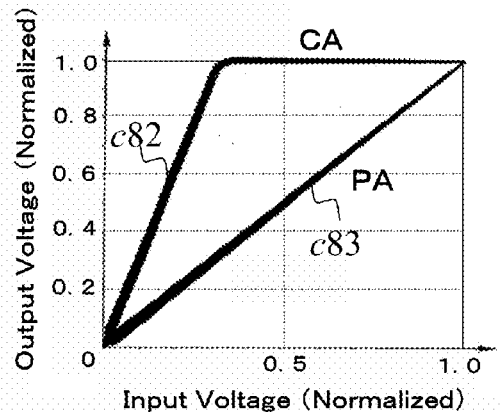

FIG. 8(*a*) shows input vs output voltage characteristics of a carrier amplifier (CA) and a peaking amplifier (PA) of the Dohery transmitter 103, and FIG. 8(*b*) input vs output voltage characteristics of the CA and PA of the Doherty transmitter 105.

Figure 9A:
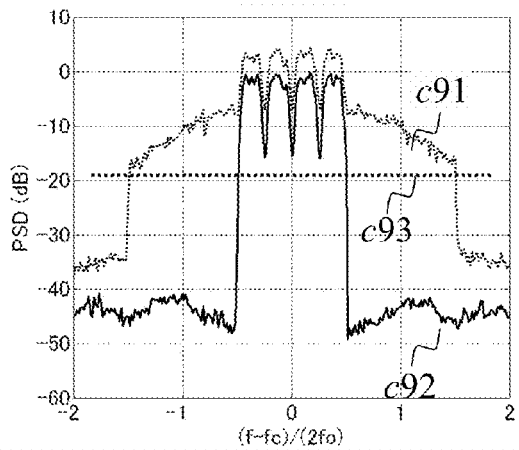
Figure 9B:
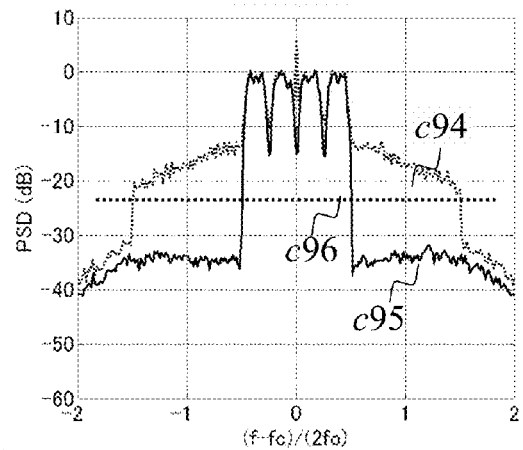

FIG. 9(*a*) shows power spectral densities (PSDs) of an EIS and a transmitter output of the Chireix transmitter 101 utilizing non-linear amplifiers (of AB-class) as a first and a second power amplifiers. FIG. 9(*b*) shows power spectral densities (PSDs) of an EIS and a transmitter output of the Doherty transmitter 103 utilizing non-linear amplifiers (of AB-class) as a first and a second power amplifiers.

FIG. 10 shows a structure of the composite transmitter 201 according to the present invention.

FIG. 11 shows a structure of a signal component separating device 80. More particularly, FIG. 11(*a*) shows a case in which a baseband signal of a first composite signal S1 and a baseband signal of a second composite signal S2 are each subjected to an orthogonal modulation before generating a first and a second composite signals S1 and S2, respectively; FIG. 11(*b*) shows a case in which baseband signals of a main signal and EIS are each subjected to an orthogonal modulation to generate an RF main signal and an RF EIS before providing a first composite signal S1 in the form of a vectorial sum of these two RF signals and a second composite signal S2 in the form of a vectorial difference between the two RF signals.

FIG. 12 are vectorial representations of a main signal and an EIS to be fed to the two power amplifiers 50 and 51 of the composite transmitter 202, for cases where the main signal are located in four different quadrants of a phase diagram.

Figure 13A:
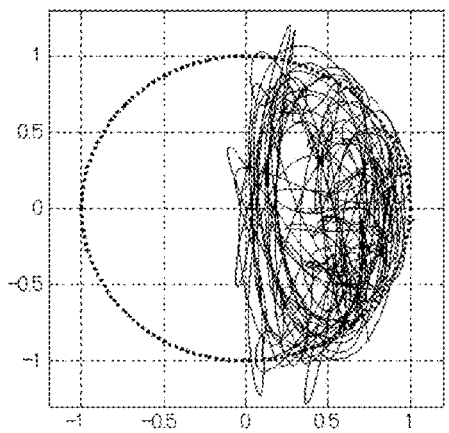

FIG. 13(*a*) shows a locus of a vector indicative of an EIS of the composite transmitter 202, and FIG. 13(*b*) shows frequency spectra of a main signal and an EIS of the transmitter.

Figure 14:
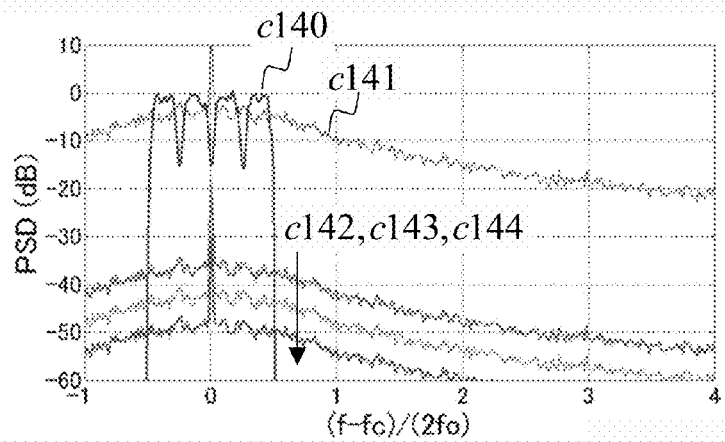

FIG. 14 shows characteristic PSDs of different signals including a main signal and an EIS of the composite transmitter 202.

Figure 15A:
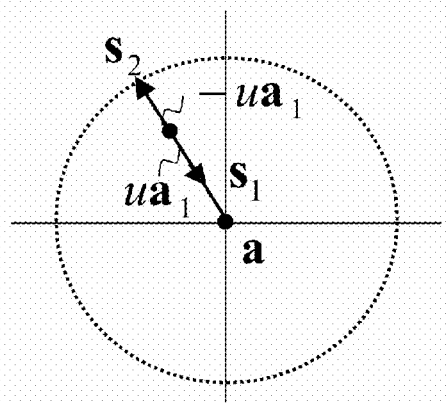
Figure 15B:
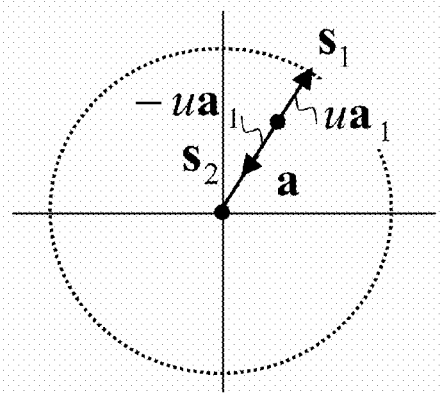

FIG. 15 shows vectorial representation of a main signal and an EIS to be fed to the two power amplifiers 50 and 51 of the composite transmitter 203 when the main signal has a peak level between C/2 and C where C is the peak envelope level of the main signal, for a case where the main signal falls in the second quadrant (FIG. 15(a)) and a case where the main signal falls in the first quadrant (FIG. 15(b)).

Figure 16A:
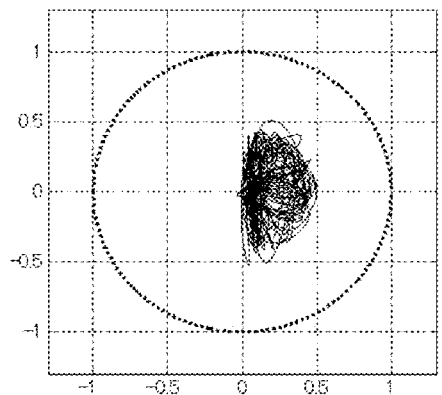

FIG. 16(a) shows a locus of a vector indicative of an EIS of the composite transmitter 203.

Figure 16B:
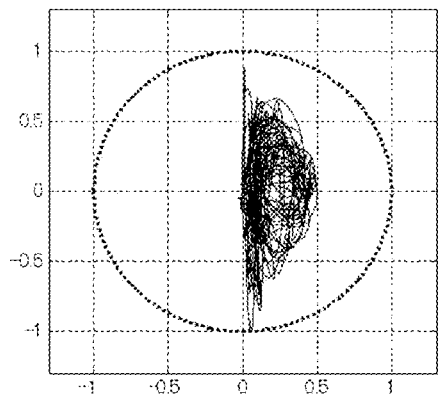

FIG. 16(b) shows a locus of a vector indicative of an EIS of the composite transmitter 204.

Figure 17A:
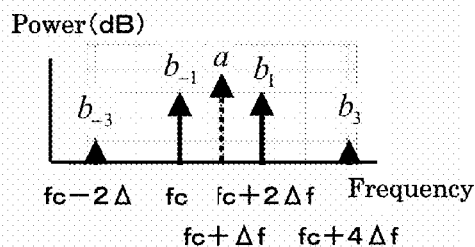

FIG. 17(a) compares power spectra of main signals EISs of the composite transmitters 203 and 204.

Figure 17B:
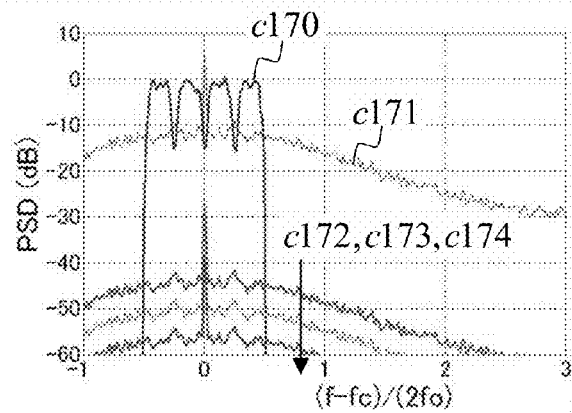

FIG. 17(b) shows characteristic PSDs of main signals and EISs of the composite transmitter 203.

Figure 18:
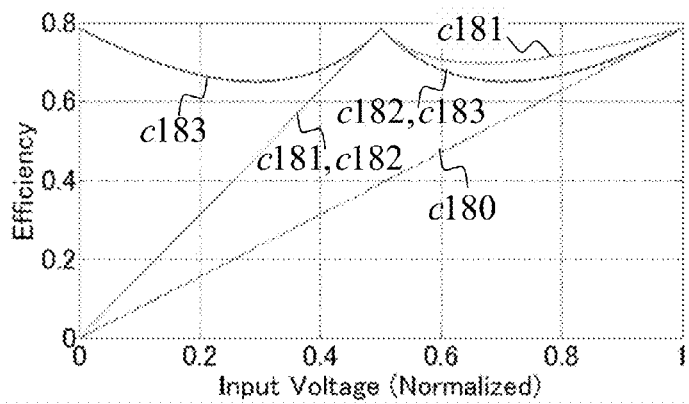

FIG. 18 shows power efficiencies versus normalized input voltage of the composite transmitter 203 (curve c182) and of the composite transmitter 204 (curve c183).

Figure 19A:
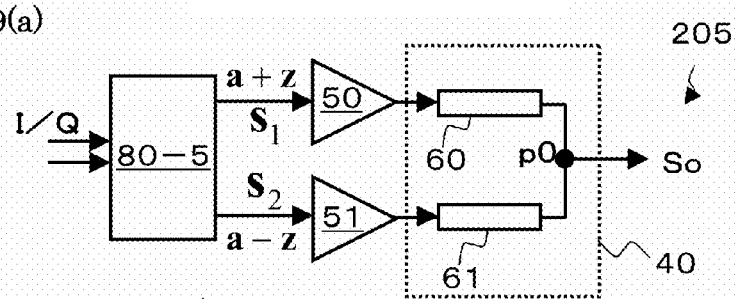
Figure 19B:
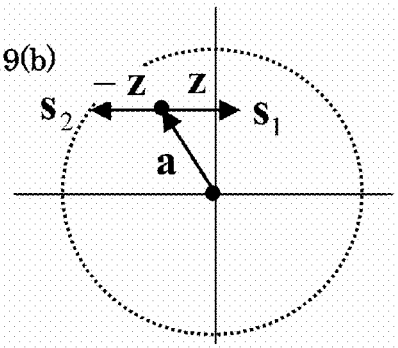
Figure 19C:
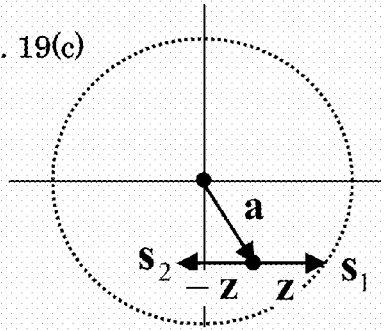

FIG. 19 shows a structure of the composite transmitter 205 according to the present invention. FIG. 19(b)-(c) show vectorial representations of a main signal and an EIS to be fed to two power amplifiers 50 and 51, for a case where the main signal is located in the second quadrant of a phase diagram (Fig. (b)), and for a case where the main signal is located in the fourth quadrant (Fig. (c)).

Figure 20A:
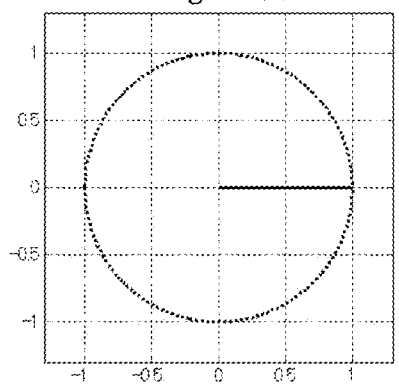
Figure 20B:
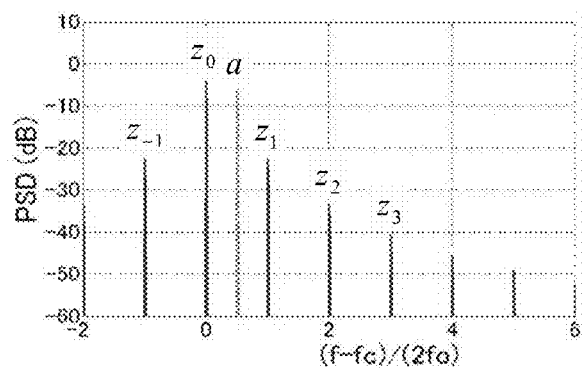

FIG. 20(a) illustrates a locus of a vector indicative of an EIS of the composite transmitter 205, showing that the EIS vector has no imaginary component and hence lies on the x-axis. FIG. 20(b) shows characteristic PSDs of a main signal and an EIS of the composite transmitter 205 in a case where a non-modulated main signal has a normalized voltage of 0.5 and a carrier frequency fc+baseband width fo.

FIG. 21 shows time waveforms of envelopes (in normalized scale) of a main signal, a first composite signal S1, and a second composite signal S2 of the composite transmitter 205.

Figure 22:
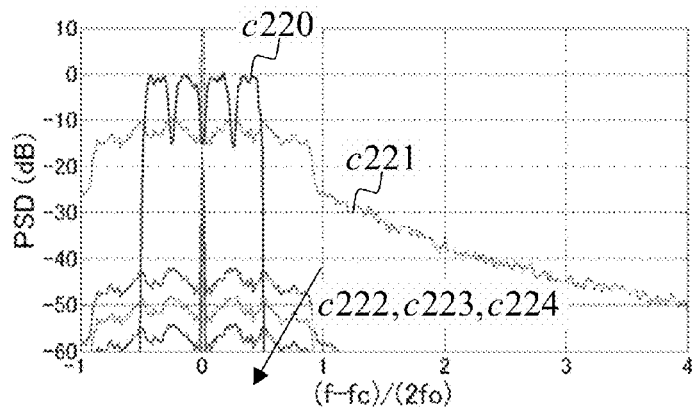

FIG. 22 shows characteristic PSDs of a main signal (curve c220), an EIS (curve c221), and residual EISs (curves c222, c223, and c224) of the composite transmitter 205.

Figure 23:
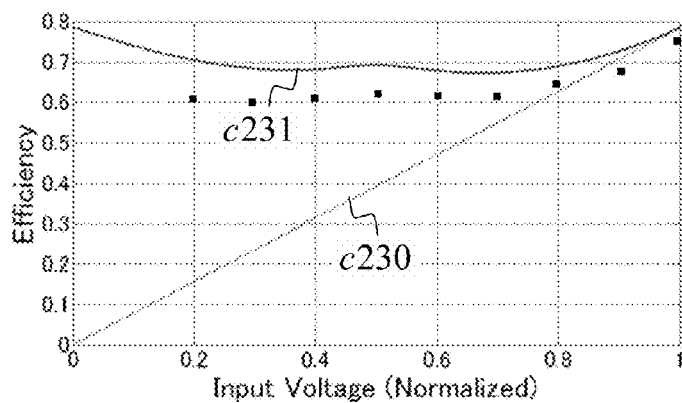

FIG. 23 shows theoretical normalized input voltage. Curve c230 indicates the theoretical power efficiency of a B-class power amplifier.

Figure 24A:
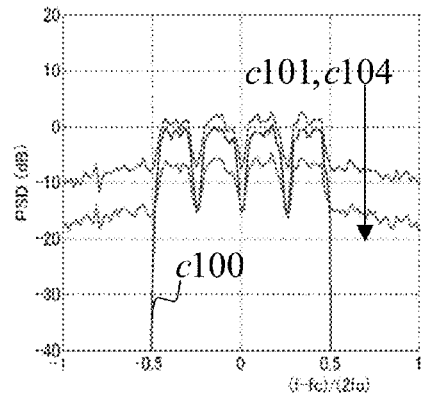
Figure 24B:
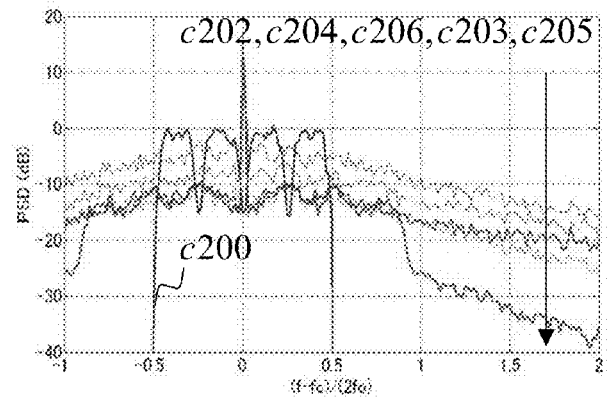

FIG. 24 compares of PSDs of main signals and EISs of an inventive composite transmitter and a prior art composite transmitter. More particularly, FIG. 24(a) shows of PSDs of the prior art Chireix transmitter 101 and the Doherty transmitter 104. Curves c100 and c101 indicate PSDs of a main signal and an EIS, respectively, of the Chireix transmitter, and curve c104 indicates a PSD of the EIS of the Doherty transmitter 104. FIG. 24(b) shows PSDs of relevant signals of the composite transmitters 202 through 206. Curve c200 indicates the PSD of the main signal of the composite transmitter 202, and curves c202, c204, c206, c203 and c205 indicate PSDs of EISs of the composite transmitters 202, 204, 206, 203 and 205, respectively, plotted in the decreasing order of power density in the neighborhood of normalized frequency of 2.

Figure 25A:
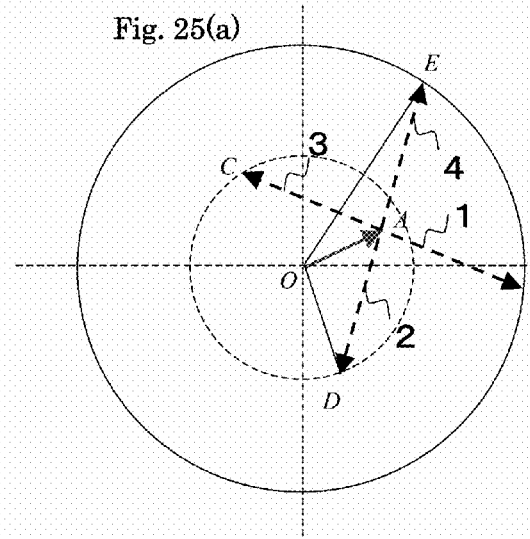

FIG. 25(a) shows, in vectorial form, a main signal OA and four EISs (AB, AD, AC, and AE) of the composite transmitter 206.

Figure 25B:
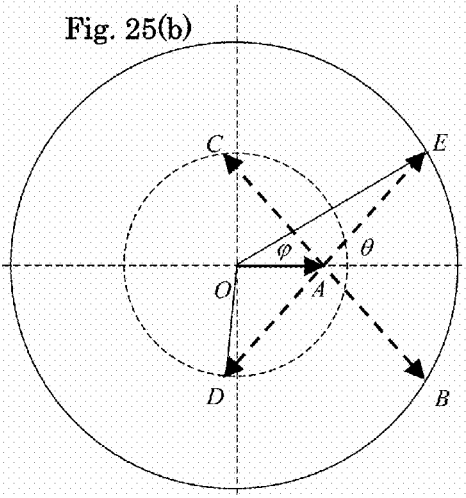

FIG. 25(b) shows, in vectorial form, the main signal and the four EISs shown in FIG. 25(a), with their frequencies shifted in the clockwise direction by the phase φ of the main signal.

Figure 26A:
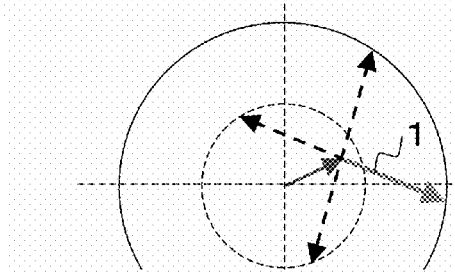
Figure 26B:
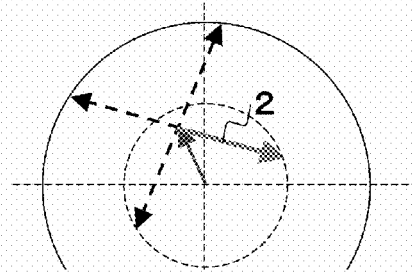

FIG. 26(a) shows that a candidate efficiency improving signal EIS1 is the most optimal EIS when the main signal is in the first quadrant. FIG. 26(b) shows that a candidate efficiency improving signal EIS2 is the most optimal EIS when the main signal is in the second quadrant.

Figure 27A:
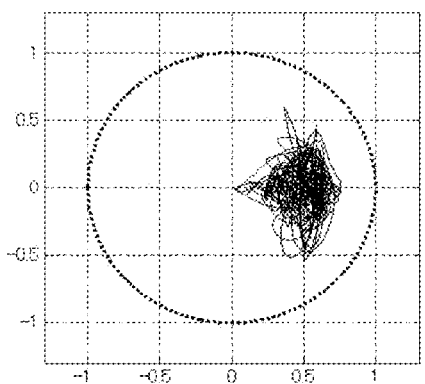

FIG. 27(a) shows a locals of a vector indicative of an EIS of the composite transmitter 206.

Figure 27B:
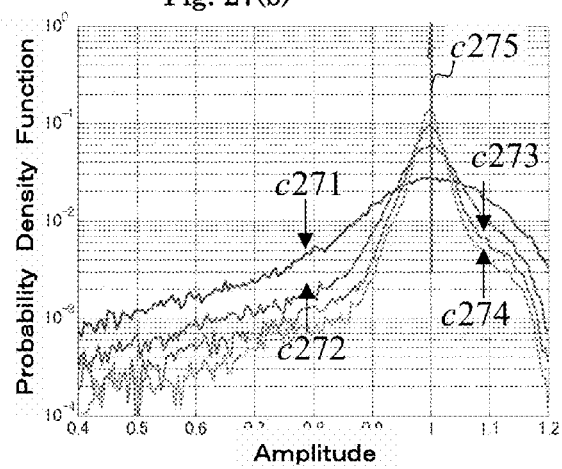

FIG. 27(b) shows PSDs of the first or the second composite signal of the prior art Chireix transmitter 101 when the composite signal has a normalized envelope level. Curves are plotted for different baseband widths of the EIS.

Figure 28:
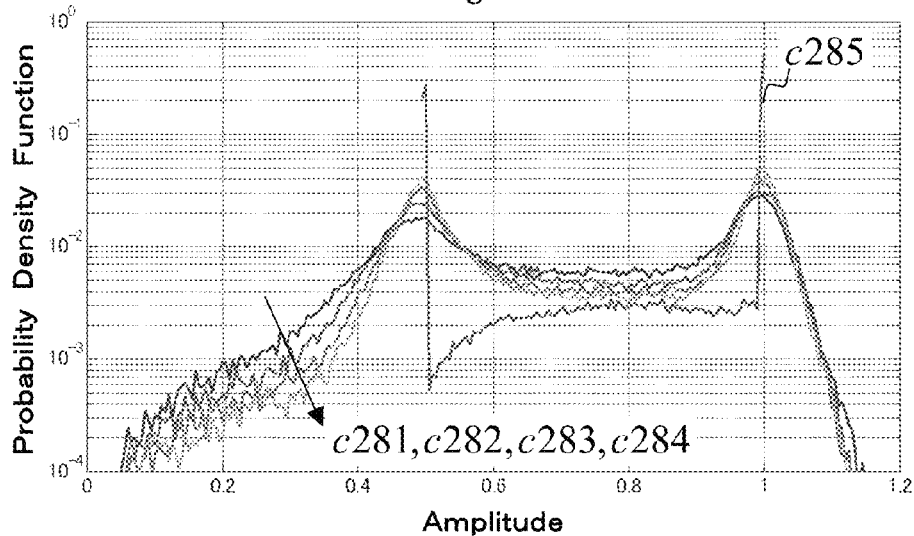

FIG. 28 shows PSDs of the EISs of a standard composite transmitter 206 which is configured to use the EIS of the composite transmitter 205 when the normalized envelope level x is less than ¼ or more than ¾, but uses the EIS of the composite transmitter 206 when the normalized envelope level x of the EIS is between ¼ and ¾. Curves are plotted for different baseband widths of the EIS when the first or the second composite signal has a normalized envelope level.

Figure 29:
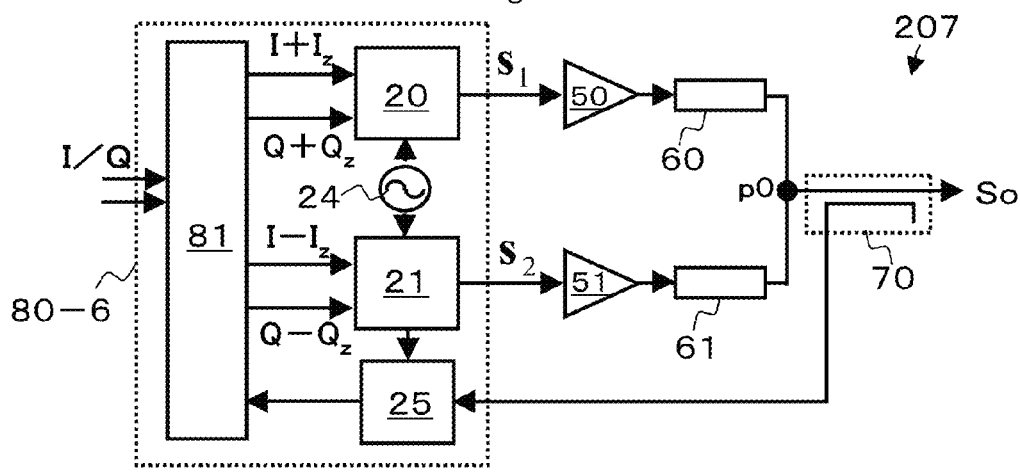

FIG. 29 shows a structure of a composite transmitter 207, which is a modification of any one of the composite transmitters 201 through 206, modified to have an additional circuit for suppressing distorted signal components.

Figure 30:
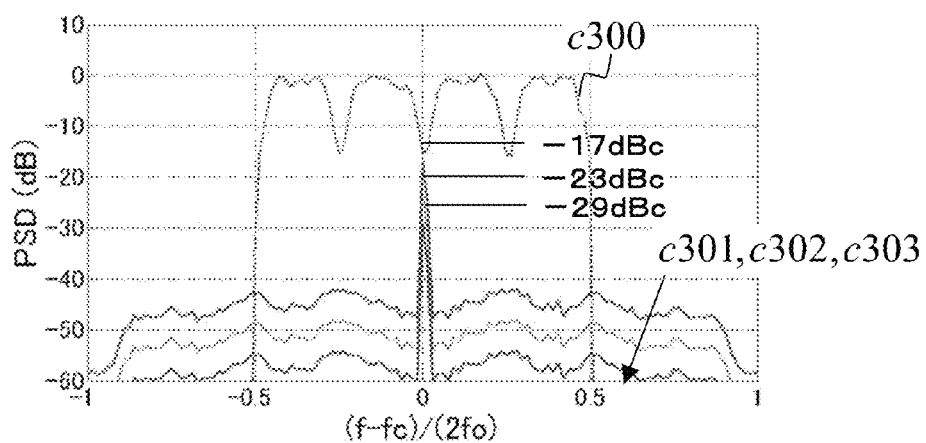

FIG. 30 shows PSDs of a main signal (curve c300) and residual efficiency improving signals (curves c301, c302, and c303) of the composite transmitter 205.

BEST MODE FOR CARRYING OUT THE INVENTION

Embodiment 1

Referring to FIG. 10, there is shown a composite transmitter 201 according to the invention, which comprises the following three components.

(1) A signal component separating device 80 which, upon receipt of an in-phase baseband signal I(t) and an orthogonal baseband signal Q(t), outputs a first composite signal S1(t) in the form of a vectorial sum of a main signal A(t) obtained by orthogonal modulation of the in-phase signal I and the orthogonal signal Q and an efficiency improving signal (EIS) obtained from the main signal by subjecting the main signal to frequency shifting and envelope conversion, and a second composite signal S2(t) in the form of a vectorial difference between the main signal and the EIS;

(2) A first power amplifier 50 for power amplifying the first composite signal S1(t) and a second power amplifier 51 for power amplifying the second composite signal S2(t); and (3) A power combiner 40 having a symmetric structure for combining outputs of the power amplifiers 50 and 51 upon receipt of the outputs via respective impedance inverters 60 and 61, providing a composite output signal of the transmitter. It is noted that each of the impedance inverters 60 and 61 is a line having a length which is equivalent to an open circuit for the EIS when the lines are viewed from either output end of the power amplifier 50 or 51.

In conventional composite transmitters (e.g. Chireix transmitter 101 and Doherty transmitter 103), a main signal and an EIS are synchronized (with their phases being either 90 degrees or −90 degrees in the Chireix transmitter 101 and either 0 or 180 degrees in the Doherty transmitters 103 and 104). In contrast, in the composite transmitter 201 of the present invention, output impedances of the power amplifiers 50 and 51 can be set up independently for the main signal and the EIS by differentiating the frequencies of the main signal and the EIS.

In constructing the signal component separating device 80, there are two approaches available, one shown in FIG. 11(a) and another shown in FIG. 11(b). In the approach shown in FIG. 11(a), use is made of an orthogonal modulator 20, that utilizes a carrier oscillator 24 as a local source, to orthogonally modulate the baseband in-phase signal I+Iz and the orthogonal baseband signal Q+Qz (both generated from the baseband signal (I/Q) by the signal separating device 81), to thereby generate a first RF composite signal S1. On the hand, an orthogonal modulator 21, that utilizes the carrier oscillator 24 as a local source, is used to orthogonally modulate the baseband in-phase signal I−Iz and the orthogonal baseband signal Q−Qz (both generated from the baseband signal (I/Q) by the signal component separating device 81), to thereby generate an second RF composite signal S2.

In the second approach shown in FIG. 11(b), a baseband signal (I/Q) is orthogonally modulated into an RF main signal A by an orthogonal modulator 22 that utilizes a carrier oscillator 24 as a local source. On the other hand, a baseband EIS (Iz/Qz) is generated by the baseband signal component separating device 82, which is in turn orthogonally modulated into an RF EIS by an orthogonal modulator 23 that utilizes a carrier oscillator 24 as a local source. Further, the main signal A and the EIS Z are inputted to a signal combiner 41 to generate the first composite signal S1 in the form of their vectorial sum. The main signal A and the EIS Z are also inputted to a signal combiner 42 to generate the second composite signal S2 in the form of a vectorial difference between them.

Let us call the composite transmitter 201 "resistor-terminated composite transmitter" when the power combiner 40 is replaced by a 180-degree hybrid circuit in such a way that the main signal is output from a zero-degree output port while high-frequency main signal current and the EIS current are passed through respective resistive loads. The DC power consumption P of the inventive composite transmitter 201 is given by the following equation.

$$P=p0-P0 \cdot P2/(P1+P2)=P0 \cdot P1/(P1+P2)  \quad (Eq.\ 13)$$

where

P0 is the d.c. power consumption by a resistor-terminated composite transmitter, P1 is the high-frequency power of the main signal, consumed by a resistive load connected to the 0-degree port, and P2 is the high-frequency power of the EIS, consumed by a resistive load connected to the 180-degree output port. Note in this case that the d.c. power consumption P is equal to P0 minus P0 times the ratio of P2/(P1+P2).

Defining by <f(t)> a long-time average of f(t) or magnitude of a direct current, and denoting by $\eta_1$ and $\eta_2$ instantaneous power efficiencies of the power amplifiers 50 and 51, respectively, the average power efficiency $\eta$ of this composite transmitter 201 is given by the following equation in terms of the ratio between the average high-frequency output power and the average dc power.

$$\eta=2\int|a|^2 dt/\int(|a+z|^2/\eta_1+|a-z|^2/\eta_2)|a|^2/(|a|^2+|z|^2)dt \quad (Eq.\ 14)$$

where the integration is made over a time interval such that $\eta$ may vary within a predetermined range. When the power amplifiers 50 and 51 are both B-class amplifiers having a maximum power efficiency $\eta_0$, efficiencies $\eta_1$ and $\eta_2$ are given by $\eta_0$ multiplied by the respective normalized envelope levels.

$$\eta_1=\eta_0|a+z|/C \quad (Eq.\ 15)$$

Plugging Eqs. 15 and 16 in Eq. 14, the average power efficiency $\eta$ of the composite transmitter 201 is obtained from the following equation for the case where the power amplifiers 50 and 51 are B-class amplifiers having a maximum power efficiency $\eta_0$.

$$\eta=2\eta_0\int|a/C|^2 dt/\int(|a+z|/C+|a-z|/C)|a|^2/(|a|^2+|z|^2)dt \quad (Eq.\ 17)$$

The present invention can be embodied in different modes such as embodiments 2 through 6, depending on how EIS is generated. The invention will now be described with reference to these embodiments, along with their power efficiency characteristics and PSD characteristics. If the composite transmitter 201 has a difference in gain between the two power amplifiers 50 and 51, then the adjacent channel leakage ratio (ACLPR) characteristic of the transmitter will become inferior as is the conventional Chireix transmitter 101. However. this problem can be circumvented by configuring the composite transmitter in a manner as embodied in a seventh embodiment.

Embodiment 2

Figure 3:
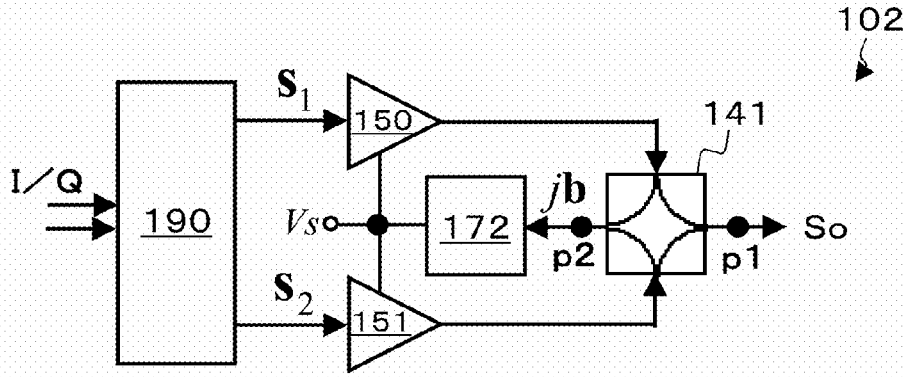
FIG. 3 shows a structure of a power-recycling type Chireix transmitter 102 having an improved power efficiency.
Figure 4A:
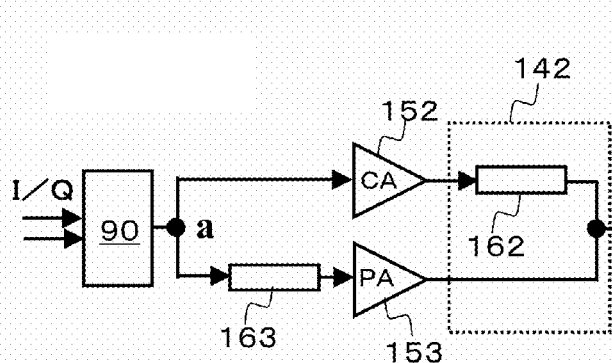
FIG. 4(*a*) shows a structure of a conventional Doherty transmitter 103, and FIG. 4(*b*) an ideal current-source model of the transmitter.
Figure 4B:
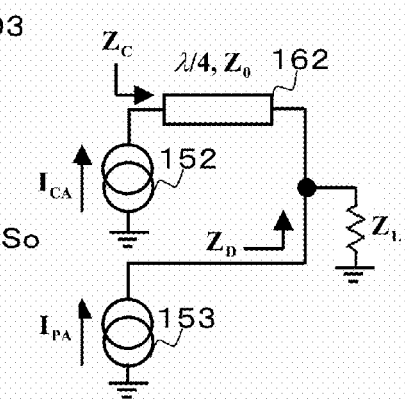

The composite transmitter 202 (not shown) is a modified version of a conventional Chireix transmitter (FIG. 3), modified in such a way that, the signal component separating device provides:

a phase determination signal u(t) (simply referred to as u) which equals +1 if the main signal has a phase in the range between $\theta_0-\pi/2$ and $\theta_0+\pi/2$ but equals −1 otherwise, where $\theta_0$ is an arbitrarily set phase, and provides an EIS (Eq. 4), whose vectorial form is given by the following equation $$jb=jb(t)\exp\{\phi(t)\} \quad (Eq.\ 18)$$

where $b(t)=\sqrt{C^2-a(t)^2}$, and C is the peak envelope level of the main signal.

A first and a second vectorial composite signals S1 and S2, respectively, given by Eqs. 19 and 20, respectively.

$$S1=a+jub \quad (Eq.\ 19)$$

$$S2=a-jub \quad (Eq.\ 20)$$

Denoting the main signal by I+jQ and the EIS by Iz+jQz, and defining the quantity b(t)/a(t), or $\sqrt{C^2/a(t)^2-1}$ as envelope conversion signal, the in-phase signal Iz of the EIS turns out to be a product of the envelope conversion signal, −Q, and the phase determination signal u, and the orthogonal signal Qz of the EIS turns out to be a product of the envelope conversion signal, the in-phase signal I, and the phase determination signal u.

When the instantaneous frequency of the main signal does not match the carrier frequency fc, the main signal appears to rotate on the phase plain referenced to the carrier frequency fc. In the conventional Chireix transmitters 101 and 102, the EIS also rotates in synchronism with the main signal and has a broader bandwidth than the main signal. The inventive composite transmitter 202 has a feature that the frequencies of the main signal and the EIS are differentiated by restraining the EIS in the form of jub or −jub within one half of the phase plane constructed with reference to a vector having the carrier frequency fc.

FIG. 12(a)-(d) are diagrams illustrating the first and the second composite signals S1 and S2, respectively, on the phase planes referenced to the carrier frequency fc of the main signal for cases where the main signal is located in the first, second, third, and fourth quadrant, respectively. It will be understood that in order to constrain the EIS vector, −jub, to remain in the right half plane of the phase plane, it suffices to choose $\theta_0 = \pi/2$ and give the phase determination signal u in accord with the following equation.

$$u(t) = \text{sign}\{Q(t)\} = Q(t)/|Q(t)| \quad \text{(Eq. 21)}$$

Alternatively, in order to constrain the EIS, −jub, in the left half plane, upper half plane, and lower half plane, respectively, it suffices to choose $\theta_0$ to be $-\pi/2$, $\pi$, or 0, respectively.

FIG. 13 shows a locus of the EIS vector, −jub, over a certain period of time when the main signal of the composite transmitter 202 is an standard RF modulated signal (as will be described in more detail later) and when the phase determination signal is given by Eq. 21. It is seen from this figure that the locus infrequently trips into the left half plane, but mostly remains in the right half plane. Reasons for such infrequent trips into the left half plane, that is, why the normalized envelope level of the EIS exceeds 1, is due to the limitation of the bandwidth of the EIS by a filter (its bandwidth limited to three times the bandwidth of the man signal).

Figure 13B:
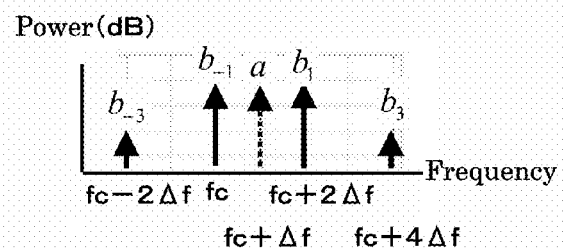

FIG. 13(b) shows PSDs of the main signal and the EIS by a broken line and a solid line, respectively, for a case where the main signal is an unmodulated signal having an envelope level of C/2 and a frequency fc+Δf. It is shown in the figure that the instantaneous frequency of the EIS takes discrete frequencies, fc+Δf±mΔf (m being an odd integer).

In PSD simulations that follow, the main signal is not an unmodulated signal but is a typical signal having a large peak-average power ratio (PAPR), obtained by peak clipping multi-carrier signals (e.g. 4-wave QPSK signal) distributed at equal angular frequency intervals on the frequency axis. The peak clipped signals will be hereinafter referred to as standard RF modulated signal. the main signal is not an unmodulated signal but is an standard RF modulated signal which is a typical multi-carrier signal having a large PAPR (peak level to average power ration). More particularly, the standard RF modulated signal is a 4-wave multicarrier signal having four QPSK signals distributed at equal angular frequency intervals on the frequency axis and subjected to peak clipping. It should be understood, however, that the use of such standard RF modulated signal in simulations is not meant to limit the multi-carrier signal to a 4-carrier signal, nor limit the inventive modulation to QPSK modulation. Therefore, the invention can be applied to a transmitter that employs a general RF modulated signal having a relatively large peak-average power ratio (PAPR), including a 1024-wave OEDM signal.

FIG. 14 shows PSD characteristics of different signals of the composite transmitter 202 when the main signal is an standard RF modulated signal. In this Figure, curve c140 indicates the PSD of the main signal, and curve c141 indicates the PSD of the EIS. Curves c142, c143, and c144 show characteristic PSDs of the residual EISs that appear in association with difference in gain between the power amplifiers 50 and 51. In the examples shown, the gain ratios between the power amplifiers 50 and 51 are 0.4 dB, 0.2 dB, and 0.1 dB.

Figure 1:
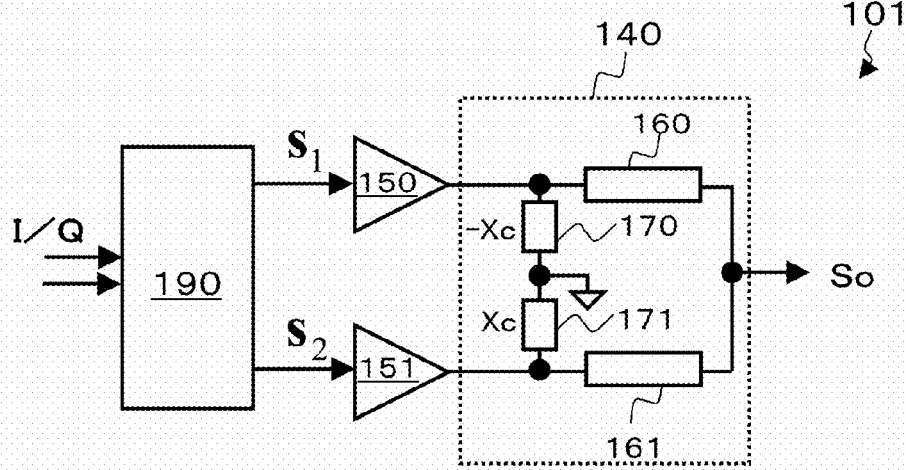
FIG. 1 shows a structure of a conventional Chireix transmitter 101.
Figure 2:
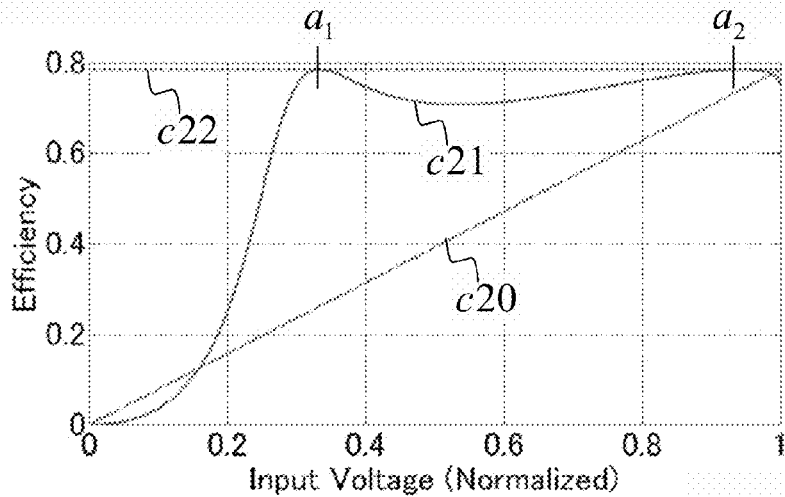
FIG. 2 is a graphical representation of power efficiency of the Chireix transmitter 101 as a function of normalized input voltage.

When the power amplifiers 50 and 51 are B-class amplifiers and their maximum power efficiencies are $\eta_0$ (=π/4), the power efficiency of the composite transmitter 202 is found to be $\eta_0$ by plugging z=jub in Eq. 17, irrespective of the voltage of the main signal (FIG. 2, curve c22).

Embodiment 3

The inventive composite transmitter 203 (not shown) is a modification of the Doherty transmitter 104 obtained by replacing the Doherty's power combiner 142 with a structurally symmetric power combiner 40. With the EIS vector $a_1$ given by Eq. 22, $$\begin{aligned} a1 &= a & (0 \le a(t) \le C/2) \\ &= \{C/|a|-1\}a & (C/2 \le a(t) \le C) \end{aligned} \quad \text{(Eq. 22)}$$

The first composite signal S1 which is a vectorial sum of the main signal, the phase determination signal u, and the EIS and the second composite signal S2 which is a vectorial difference between the main signal and the EIS are given by the following Eqs. 23 and 24, respectively.

$$S1 = a + ua1 \quad \text{(Eq. 23)}$$

$$S2 = a - ua1 \quad \text{(Eq. 24)}$$

In order to narrow the frequency bandwidth of the EIS of the composite transmitter 203, it is also important for an improvement of its ACLR characteristic to reduce the spectral regrowth power density. FIG. 15 shows behaviors of the main signal A, the EIS $ua_1$ the first composite signal S1, and the second composite signal S2 on the phase plane referenced to the carrier frequency fc (that is, on the phase plane drawn with respect to a fiducial vector having the carrier frequency fc) so that the EIS vector $ua_1$ remains in the right half plane of the phase plane under a condition that $\theta_0=0$. FIG. 15(a) shows a case where the main signal A is in the second quadrant, while FIG. 15(b) shows a case where the main signal is in the first quadrant. FIG. 16(a) shows a locus of the EIS vector over a given period of time, exhibiting the locus remaining in the right half plane when the main signal is the standard RF modulated signal. This manifests that the instantaneous frequency of the EIS is converted to the carrier frequency fc. FIG. 16(b) will be described in detail later in connection with a fourth embodiment.

FIG. 17(a) shows power spectra of a main signal and an EIS when the carrier frequency is fc and the main signal is an unmodulated signal having an envelope level of C/2 and a frequency of fc+Δf. It is seen in the figure that the instantaneous frequencies of the EIS are fc+Δf±m Δf (with m being an odd integer). FIG. 17(b) shows PSDs of different signals of the composite transmitter 203 when the main signal is a standard RF modulated signal (4-wave QPSK signal), where curves c170 is the PSD of the main signal, c171 PSD of the EIS, while c172, c173, and c174 are PSDs of EISs for three different gain ratios (0.4 dB, 0.2 dB, and 0.1 dB) of the power amplifier 50 to that of the power amplifier 51.

Assuming that the power amplifiers 50 and 51 of the composite transmitter 203 are B-class amplifiers having a maximum power efficiency of $\eta_0$ (=π/4), the power efficiency of the composite transmitter is obtained by plugging z=$ua_1$ in Eq. 17. The power efficiency is shown in FIG. 18 (curve c182). It is noted that curve c181 represents the power efficiency of the Doherty transmitter 103, and curve c180 represents a power efficiency of a B-class amplifier. It is seen from the figure that the composite transmitter 203 has the same power efficiency as the conventional Doherty transmitter 103 in a domain where the envelope level of the main signal is not more than C/2 (small power domain), but has an inferior power efficiency (as low as the level as shown in the figure) in a domain above C/2. Curve c183 will be discussed in connection with the embodiment 4.

Embodiment 4

The composite transmitter 204 (not shown) is a modification of the composite transmitter 203, modified to improve the power efficiency of the latter. The composite transmitter 204 utilizes an EIS $a_1$ that is obtained by replacing the envelope level of the main signal with the peak level C of the main signal minus the main signal, irrespective of the input voltage of the main signal, as calculated by the following equation.

$$a1=\{C/|a|-1\}a \quad \text{(Eq. 25)}$$

This is a contrast to the composite transmitter 203 in which the EIS $a_1$ assumes different values depending on whether the voltage of the main signal is smaller than C/2 or greater than C/2.

Since the envelope level of either the first composite signal S1 or the second composite signal S2 is equal to C or close to C even in the small power domain when the EIS is given by Eq. 25, the composite transmitter 204 has an a better power efficiency than the composite transmitter 203. The power efficiency of the composite transmitter 204 can be obtained by plugging $z=ua_1$ in Eq. 17, which is represented by curve c183 as shown in FIG. 18. It is seen in FIG. 18 that this power efficiency is higher than that of the Doherty transmitter 103. However, as a compensation for this improvement, PSD of the EIS is also increased, as indicated by curve c204 shown in FIG. 24(b) below.

FIG. 16(b) shows a locus of a vector indicative of an EIS on a phase plane over a certain period of time when the main signal is a standard RF modulation signal. It is shown here that the instantaneous frequency of the EIS is converted to the carrier frequency fc, since the locus remains in the right half of the phase plane.

Embodiment 5

In the foregoing examples described above (composite transmitters 202, 203, and 204), the frequencies of the main signal and the EIS are differentiated by limiting the phase of the EIS within a range between $\theta_0-\pi/2$ and $\theta_0+\pi/2$ for an arbitrarily chosen phase $\theta_0$. In contrast, a composite transmitter 205 of a fifth embodiment (FIG. 19) differentiates the frequencies of the main signal and the EIS By setting a variable range of frequency of the EIS to zero, that is, the phase of the EIS is fixed, so that broadening of the EIS spectrum will be still narrowed as compared with any of the foregoing transmitters.

It will be recalled that in the composite transmitters 202, the phase of the EIS is either $\phi(t)\pm\pi/2$ and in the composite transmitter 203 and 204, the phase of EIS is $\phi(t)$ or $\phi(t)\pm\pi$, where $\phi(t)$ is the phase of the main signal (Eq. 2), and that the EIS vector begins to rotate rapidly on the phase plane as the instantaneous frequency of the main signal departs from the carrier frequency fc so that the main signal vector rotates on the phase plane referenced to the carrier frequency fc, which results in broadening of the frequency bandwidth of the EIS. Considering this point, in the composite transmitter 205, an inverse rotational angle $-\phi(t)$ is added to the main signal to fix the EIS on the phase plane.

With such an opposite rotational angle added to the main signal to thereby fix the phase of the EIS on the phase plane, there will be generated a difference in angular frequency between the main signal and the EIS given by a time derivative $d\phi(t)/dt$, so that the main signal and the EIS will become orthogonal to each other, thereby satisfying one of the criteria for establishing the composite transmitter 201. If the lengths of impedance inverters 60 and 61 are chosen such that the power combining end p0 (FIG. 19) becomes a short circuit point for the EIS, rendering each of the output impedances of the power amplifiers 50 and 51 equalized to an open circuit impedance, then the output current of the EIS is nullified and hence so is the power consumption associated with the EIS (not perfectly zero in actuality, though).

Although the phase $\theta_1$ of the EIS (or z) is arbitrary, it is assumed here to be zero for sake of simplicity. The EIS z, first composite signal S1, and second composite signal S2 can be graphically represented on the phase plane referenced to the carrier frequency, as shown in FIG. 19(b) (in a case where the envelope level of the second composite signal S2 is C, and the main signal is in the second quadrant) and in FIG. 19(c) (in a case where the envelope level of the first composite signal S1 is C, and the main signal is in the fourth quadrant). The EIS z, first composite signal S1, and second composite signal S2 can be given by the following equations.

$$z=z_1(t) \quad \text{(Eq. 26)}$$

$$S1=a+z \quad \text{(Eq. 27)}$$

$$S2=a-z \quad \text{(Eq. 28)}$$

Solving these equations for $z_1(t)$ under the condition that the first composite signal S1 or the second composite signal S2 has an envelope level equal to the peak envelope level C of the main signal A, $z_1(t)$ is given by Eq. 29 below.

$$z_1(t)=\sqrt{C^2-Q(t)^2}-|I(t)| \quad \text{(Eq. 29)}$$

Taking arbitrarily the phase $\theta_1$ of EIS Z, and writing the EIS in the following form, $$z=z_2(t)\exp(j\theta_1) \quad \text{(Eq. 30)}$$

The envelope level $z_2(t)$ of the EIS is given by $$z_2(t)=\sqrt{C^2-Q'(t)^2}-|I'(t)| \quad \text{(Eq. 31)}$$

where I'(t) is the real part of the main signal shifted in the negative direction by a phase angle $\theta_1$, and Q'(t) is the imaginary part of the main signal, as given by the following equations.

$$I'(t)=I(t)\cos\theta_1+Q(t)\sin\theta_1 \text{ and}$$

$$Q'(t)=Q(t)\cos\theta_1-I(t)\sin\theta_1$$

Except for cases where $\theta_1$ equals 0, $\pi$, $\pi/2$, or $-\pi/2$, the baseband signal of the EIS given by Eq. 31 is rather complex, but the power of the transmitter is not improved at all. Therefore, it is sensible from a practical point of view to chose the phase of the EIS as 0 or $\pi/2$.

FIG. 20(a) illustrates a locus of the EIS vector of the composite transmitter 205 when the phase of the EIS is taken to be zero, so that the locus is a straight line lying on the x axis. It is seen that the broadening of PSD of the EIS is relatively small (as will be discussed later in connection with curve c205 shown in FIG. 24(b). FIG. 20(b) shows power spectra of the main signal (broken line) and the EIS (solid line) when the main signal is unmodulated signal having an envelope level of C/2 and a frequency of fc+$\Delta$f, where $\Delta f=f_0$ (that is, the main signal has an upper most frequency of its frequency band). It can be understood from this figure that most of the EIS energy is concentrated at the carrier frequency fc and that second most energy is concentrated at fc+2n$\Delta$f, where n is an integer.

Figure 21A:
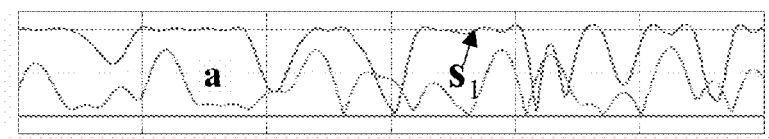
Figure 21B:
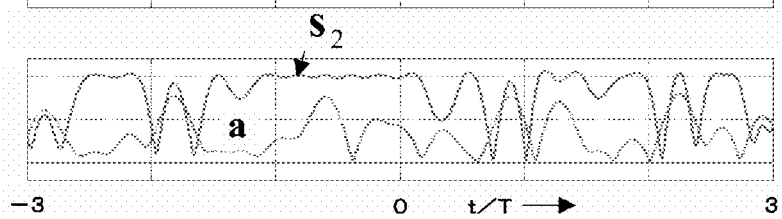

FIG. 21 shows time waveforms of envelopes of the main signal and the first composite signal S1 (FIG. 21(a)) and time waveforms of envelopes of the main signal and the second composite signal S2 (FIG. 21(b)) when the main signal is an standard RF modulated signal. It is seen in the figures that either the first composite signal S1 or the second composite signal S2 has its envelope level equal to the peak envelope level C of the main signal. (Strictly speaking, levels of these composite signals may differ slightly from C due to the frequency band limitation imposed on the EIS.) Note that the abscissa indicates normalized time t/T where t is time and T is the period of the main signal. (T is the inverse of the baseband frequency bandwidth $f_0$ of the main signal.) It should be noted that, in the case where the phase $\theta_1$ of the EIS is zero for example, the envelopes of the signals S1 and S2 match C simultaneously only at the moment when the phase of the main signal is either □/2 or $-\pi/2$.

FIG. 22 shows PSDs (c220, c221, c222, c223, and c224) of the main signal, EIS, and of three residual EIDs that appear associated with three different gains between the two power amplifiers 50 and 51, when the main signal is a standard RF modulated signal. The three PSD curves c222, c223, and c224 of the three residual EISs correspond to three ratios, 0.4 dB, 0.2 dB, and 0.1 dB, respectively, of the gain of the power amplifier 50 to that of the power amplifier 51. Assuming that the power amplifiers 50 and 51 are B-class amplifiers, the power efficiency (curve c231 shown in FIG. 23) of the composite transmitter 205 can be determined by substituting the expression z of the EIS, obtained from Eqs. 26 and 29 or from Eqs. 30 and 31, in Eq. 17. Although the power efficiency of the main signal decreases near an intermediate input power level of the main signal, it is close to the maximum power efficiency $\eta_0$ in a small frequency domain. Thus, in this respect, the composite transmitter 205 has a superb feature than the conventional Chireix transmitter 101 and the Doherty transmitter 103, since the power efficiencies of the latter sharply drop down as the main signal level drops down. Black dots seen closely along curve 231 indicates measured power efficiencies, showing a high feasibility of the composite transmitter 205. (These measurements were made using a composite transmitter having an operating frequency of 2.1 GHz and equipped with power amplifiers 50 and 51 that use GaN semiconductors.)

FIG. 24(b) shows PSDs (curves 202, 203, 204, 205, and 206) of the composite transmitters 202-206 described above, in the decreasing order of PSD outside the frequency band. (Curves 202, 204, and 206 will be described in detail later in connection with a sixth embodiment). Curve c200 represents a PSD of the main signal. It is seen from this figure that the composite transmitter 205 has the lowest power spectral density outside the frequency band, showing that the composite transmitter 205 is the best transmitter from the point of ACLD characteristic. FIG. 24(a) shows PSDs of conventional transmitters provided for readers' reference. Curve c100 represents the PSD of the main signal, curve c101 PSD of the EIS of the Chireix transmitter 101, and curve 104 the PSD of the EIS of the Doherty transmitter 104.

Embodiment 6

The composite transmitter 206, a sixth embodiment according to the invention, has a feature that during a period of when either one of the first and the second power amplifier is in operation at a discrete level below the saturated envelope level C (for example C/2, C/3, or 2C/3), the other one is in operation at its saturated level C. Since in any of the foregoing composite transmitters 202 through 205 (embodiments 2 through 5) the frequency bandwidth cannot be made infinitely large due to a limitation on the operational speed of the digital signal processing device used, the first and second power amplifiers are required to have a predetermined linearity in order to lower, below a predetermined level, the level of spectral regrowth that takes place outside the frequency band of the EIS, as described above in the connection with FIG. 9. The composite transmitter 206 has a feature that the first and the second power amplifiers are configured to operate under a more relaxed linearity condition than the foregoing composite transmitters in that the power amplifiers are operable at discrete envelope levels at or below the saturated envelope level C. FIG. 25(a) shows the main signal, EIS, and the first and second composite signals of the transmitter 206 as indicated by vectors OA, AE, OE, and OD, respectively. Their envelope levels are normalized by the peak envelope level C of the main signal. It is seen that when the normalized envelope level of the first composite signal is 1 and the normalized envelope level of the second composite signal is d, the tip E of the vector OE of the first composite signal stays on a circle of radius 1 and the tip of the vector OD of the second composite signal stays on a circle of radius d. When the normalized envelope level of the first or the second composite signal is 1, there are four EIS candidate vectors, EIS1 through EIS4 say, for the other the EIS that have an envelope level of d but have different phases, as shown in FIG. 25(a). Their phase relationships can be shown in a more comprehensive manner if FIG. 25(a) is rotated in the clockwise direction by the phase $\phi(f)$ of the main signal, as shown in FIG. 25(b). Referring to FIG. 25(b), the four candidates EIS1-EIS4 can be determined as follows. Denoting by Is and Qs the real part and the imaginary part, respectively, of the EIS4, so that EIS4 is Is+jQs, it is seen in FIG. 25(b) that real parts of other EISs turn out to be Is or −Is, and imaginary parts to be Qs or −Qs. Therefore, EIS1, EIS2, EIS3, and EIS4 can be written in the following forms, respectively.

$$Is-jQs, -Is-jQs, -Is+jQs, \text{ and } Is+jQs, \quad (Eq. 32)$$

Referring to FIG. 25(b), the real part Is and the imaginary part Qs of the EIS4 can be written in the following form.

$$Is = \cos\phi - x = (1-d^2)/4/x$$

$$Q_S = \sin\phi = \sqrt{1-\cos^2\phi} = \sqrt{1-\{(1-d^2)/4/x+x\}^2} \quad (Eq. 33)$$

where $\phi$ is the angle between the vectors OA and OE and x is the normalized envelope level of the main signal.

From the condition that Qs be a real number, the allowable range of x is given by Eq. 34.

$$1-\{(1-d2)/4/x+x\}2>0 \text{ or } \tfrac{1}{2}-d/2 \le x \le \tfrac{1}{2}+d/2 \quad (Eq. 34)$$

From the expressions of four candidate EISs on the premise that the phase of the main signal is zero (FIG. 25(b)), true expressions of the four EISs with respect to the main signal having a phase angle of $\phi(t)$ can be obtained by multiplying each of the formula (Eq. 32 by a rotational operator given by.

$$\exp(j\phi) = I/\sqrt{I^2+Q^2} + jQ/\sqrt{I^2+Q^2} \quad (Eq. 35)$$

We have discussed in Embodiment 5 how spectral broadening of the EIS can be suppressed by choosing an appropriate one of the four candidates for the EIS in order to have the phase of the EIS fixed at a constant level (zero level, for example). We now follow the same principle in selecting a proper EIS among the four candidates. One way to suppress spectral broadening of the EIS is to select one candidate EIS that has a phase closest to zero phase irrespective of the quadrant of the phase plane in which the main signal vector is located.

FIG. 26(a) shows a case in which EIS 1 be selected as the EIS having the least phase (closest to zero degree) when the main signal is in the first quadrant. FIG. 26(b) shows a case in which EIS 2 be selected as the EIS having the least phase (closest to zero degree) when the main signal is in the second quadrant. Similarly, EIS 3 (not shown) be selected when the main signal is in the third quadrant and EIS4 be selected as the EIS when the main signal is in the fourth quadrant. In summary, the candidate to be selected as the EIS is given by the following equation.

$$\{\text{sign}(I)Is - j\text{sign}(Q)Qs\}\exp(j\phi) \qquad \text{(Eq. 36)}$$

The composite transmitter 206 will be referred to as standard composite transmitter 206 when the transmitter uses the same EIS as the transmitter 205, but the first and the second composite signals assume one of binary levels C and C/2 and the main signal has a normalized envelope level not more than ¼ or not less than ¾. FIG. 27(a) shows a locus of the EIS vector of the composite transmitter 206B when the baseband bandwidth is $3f_0$. Comparing the locus of FIG. 27(a) with loci of the EIS vectors of the composite transmitters 202-205 (FIGS. 13, 16(a), 16(b), and FIG. 20(a)), it is understood that the locus is also restricted to remain within the right half plane of the phase plane, but, in addition, the locus moves in a more limited domain than those for the preceeding transmitters of the composite transmitter 205 (except for the domain FIG. 20(a)). This means that the composite transmitter 206 also satisfies an important criterion to have a relatively narrow frequency bandwidth for the EIS. Characteristic probability density functions (PDFs) of the first and the second composite signals of the standard composite transmitter 206 are shown in FIG. 28. Curves c281-c285 represent PSDs of the EIS plotted for baseband widths of $2f_0$, $3f_0$, $4f_0$, $5f_0$, and ∞. For comparison, the PDFs (curves c271-c275) of the EIS of the conventional Chireix transmitter 101 for the same set of bandwidths ($2f_0$, $3f_0$, $4f_0$, $5f_0$, and ∞) are plotted in FIG. 27(b). Comparing FIG. 27(b) (particularly curve c272) with FIG. 28 (particularly curve c282), one sees that broadening of the PDF of the composite transmitter 206 that utilizes EIS in a limited bandwidth is narrower than that of a conventional Chireix transmitter 101. This point is a great advantage of the composite transmitter 206 since the first and the second power amplifiers are required to have linearity only near discrete envelope levels.

When a multiplicity of discrete envelope levels are available to the first and the second composite signals for a given x (normalized envelope level of the main signal) within a certain range, normalized envelope levels of the first and the second composite signals can take any two different envelope levels (e.g. $d_1$, $d_2$ for example). For example, if $d_1 = ⅓$ and $d_2 = ⅔$ and x is between ⅓ and ⅔, the normalized envelope levels of the first and the second composite signals can take $d_1$ and/or $d_2$. In such a case as described above, as is the case of the composite transmitter 205, the most natural and practical selection of good EIS is one having the least phase (that is, close to zero degree).

Embodiment 7

It has been pointed in the foregoing discussions of the composite transmitters 201-206 that deterioration of ACLR characteristic (adjacent channel leakage-power ratio) will arise if there is a difference in voltage gain between the two power amplifiers 50 and 51. A solution for this problem will now be described below in conjunction with a seventh embodiment according to the invention. A composite transmitter 207 shown in FIG. 29 is constructed from any one of the foregoing composite transmitters 201 through y adding thereto the following functional structures.

(1) a structure (e.g. a directional coupler 70 in the example shown in FIG. 29) for extracting a part of the output $S_0$ of the composite transmitter 207;

(2) a structure for outputting a distorted signal that is obtained by cancelling out the main signal from a part of the output $S_0$ and orthogonally demodulating the resultant partial output;

(3) a structure for outputting a gain control signal that is obtained by suppressing the fluctuating amplitude of the distorted signal;

(4) a structure for controlling, by means of the gain control signal, gain of a first line between an input end of the signal component separating device 80-6 and an output end p0 of the transmitter via the power amplifier 50 and/or gain of a second line between the input end and the output end p0 via the power amplifier 51.

The gain control of the first and/or second line(s) by the gain control signal suppresses the level of a distorted component to a predetermined level. Sources of distorted signals created in a composite transmitter can be classified into two categories: (i) distorted signals due to non-linear input-output characteristics of the first and the second power amplifiers, (ii) residual distorted signals appearing in the output of the transmitter due to a difference in gain between the first and the second power amplifiers.

Of these distorted signals, the residual distorted signals can be suppressed in a relatively simple manner as described below with reference to FIG. 30. FIG. 30 is similar to FIG. 22, but has a different frequency range. In FIG. 30, curve c300 represents the PSD of the main signal. Curves c301, c302, and c303 represent PSDs of residual distorted signals that appear when the power amplifiers 50 and 51 have gain ratios of 0.4 dB, 0.2 dB, and 0.1 dB, respectively. The residual distorted signals contain line spectra (e.g. curve c301, c302, and c303 shown in FIG. 30) whose frequency matches the carrier frequency fc. Voltages of these line spectra (which are −17, −23, and −29 dBc, in FIG. 30) are proportional to the respective average voltages of the residual distorted signals, so that the line spectra can be utilized as gain control signals. In view of fact that in a conventional Chireix transmitter 101 an unmodulated pilot signal is fed to each of the power amplifiers 150 and 151 to suppress a gain difference between the two power amplifiers, it is a unique feature of the present invention that such line spectra contained in the residual distorted signals having the carrier frequency fc are used to suppress the difference in gain between the two power amplifiers.

BRIEF DESCRIPTIONS OF THE REFERENCE NUMERALS

20, 21, 22, 23 orthogonal modulators
24 carrier oscillator
25 demodulator
40 power combiner
41, 42 combiners
50, 51 power amplifiers
60, 61 impedance inverter
70 directional coupler
80, 80-5, 80-6 signal component separating devices 81, 82 signal component separating devices
90 orthogonal modulator
95 signal component separating device
101 Chireix transmitter
103, 104, 105 Doherty transmitter
140 Chireix power combiner
141 180-degree hybrid circuit
142 Doherty combiner network
143 signal combiner
144 high-frequency-to-DC converter
150, 151, 152, 153 power amplifiers
160, 161, 162 impedance inverters
163 ¼-wavelength line
170, 171 reactance element
172 high-frequency-DC converter
181 non-linear emulator
182 cross-coupling filter
190, 191 signal component separating device
201, 202, 203, 204 composite transmitter
205, 206, 207 composite transmitter

The invention claimed is:

1. A composite transmitter, comprising:
a signal component separating device which, upon receipt of an in-phase signal I and an orthogonal signal Q of a baseband modulation signal, is configured to generate
a first composite signal in the form of a vectorial sum of
a main signal and an efficiency improving signal (EIS), where the main signal is obtained by orthogonal modulation of I and Q while the EIS is obtained from the main signal through frequency-shifting and envelope-modulation thereof, and
a second composite signal in the form of a vectorial difference between the main signal and the EIS;
a first power amplifier for power amplifying the first composite signal and a second power amplifier for power amplifying the second composite signal; and
a power combiner for combining an output of the first power amplifier and an output of the second power amplifier to provide a composite power at its power combining end, the composite transmitter characterized in that
the signal component separating device is further configured to differentiate instantaneous frequencies of the EIS and the main signal by restraining the phase of the EIS within a predetermined range centered about an arbitrarily given phase $\theta_0$; and
a first line length between a first input end and the power combining end of the power combiner and a second line length between a second input end and the power combining end of the power combiner are configured such that each of the first and the second lines is equivalent to an open circuit for the EIS when the lines are viewed from either output end of the power amplifiers.

2. The composite transmitter according to claim 1, wherein the signal component separating device provides:
a phase determination signal u(t) which is +1 if the phase of the main signal is in a range between $\theta_0-\pi/2$ and $\theta_0+\pi/2$ but is −1 otherwise;
a baseband in-phase signal Iz of the EIS which is given by a first product of:
an envelope conversion signal defined by the square root of a quantity minus 1 where the quantity is a square of peak envelope level C of the main signal divided by a square of an envelope level of the main signal;
the orthogonal signal −Q obtained by multiplying Q by −1; and
the phase determination signal u(t),
and
a baseband orthogonal signal Qz of the EIS which is given by a second product of:
the phase determination signal u;
the in-phase signal I; and
the envelope conversion signal, or, alternatively,
a baseband in-phase signal Iz given by the first product multiplied by −1, instead of the first product itself, and/or
a baseband orthogonal signal Qz given by the second product multiplied by −1, instead of the second product itself.

3. The composite transmitter according to claim 1,
wherein the signal component separating device provides:
a phase determination signal u(t) which is +1 if the phase of the main signal is in a range between $\theta_0-\pi/2$ and $\theta_0+\pi/2$ but is −1 otherwise;
an EIS which is given by a first product of
the main signal and
the phase determination signal u
when the main signal has an envelope level less than half its peak envelope level C, or
an EIS which is given by a second product of:
the phase determination signal u and
a composite signal obtained by combining
a signal derived from the main signal by shifting the phase of the main signal by 180 degrees and
an envelope signal E which is obtained from the main signal by replacing the envelope level of the main signal with the peak envelope level C
when the envelope level of the main signal falls in a range between C/2 inclusive and C inclusive, or alternatively,
an EIS given by the first and the second products both multiplied by −1.

4. The composite transmitter according to claim 1,
wherein the signal component separating device provides:
a phase determination signal u(t) which is +1 if the phase of the main signal is in a range between $\theta_0-\pi/2$ and $\theta_0+\pi/2$ but is −1 otherwise;
an EIS given by a product of
the phase determination signal u and
a composite signal composed of an envelope signal E which is obtained from the main signal by replacing the envelope level of the main signal with the peak envelope level C, and of a signal obtained from the main signal by shifting its phase by 180 degrees;
or
an EIS obtained by multiplying the product by −1.

5. The composite transmitter according to claim 1,
wherein the signal component separating device provides
a signal having a real part of I' and an imaginary part Q', obtained from the main signal by shifting the main signal by an arbitrarily phase $\theta_1$ in the negative direction; and
an EIS signal having the phase $\theta_1$ and an envelope level z,
where
z is given by the square root of a first quantity minus a second quantity;
the first quantity is given by a square of the peak envelope level C of the main signal minus the square of the imaginary part Q'; and
the second quantity is given by the absolute value of the real part I'.

6. The composite transmitter according to claim 1,
wherein the signal component separating device conditions the EIS such that a normalized envelope level x obtained from the main signal by dividing its envelope level by its peak envelope level C, falls within a first range from $\frac{1}{2}-d/2$ to $\frac{1}{2}+d/2$, or within a further limited second range which lies in the first range, by choosing d as either:
  a normalized envelope level of the second composite signal, obtained therefrom by dividing its envelope level by the peak envelope level C of the main signal, when the normalized envelope level of the first composite signal, obtained therefrom by dividing its envelope level by the peak envelope level C, is equal to 1, or
  the envelope level of the first composite signal when the normalized envelope level of the second composite signal is equal to 1, whereby d is a real number between 0 and 1.

7. The composite transmitter according to claim 2, further comprising:
  a structure for forming a bifurcated signal extracted from an output signal of the transmitter;
  a structure for forming a distorted signal by orthogonally demodulating the bifurcated signal and canceling out the in-phase signal I and/or the orthogonal signal Q of the main signal;
  a structure for controlling a gain or gains of a first line and/or a second line by the distorted signal, the first line lying between an input end of the signal component separating device to the output end of the transmitter via the first power amplifier, and the second line lying between the input end of the signal component separating device and the output end of the transmitter via the second power amplifier,
  whereby ACLP components contained in the transmitter output are reduced to a predetermined level.

8. The composite transmitter according to claim 3, further comprising:
  a structure for forming a bifurcated signal extracted from an output signal of the transmitter;
  a structure for forming a distorted signal by orthogonally demodulating the bifurcated signal and canceling out the in-phase signal I and/or the orthogonal signal Q of the main signal;
  a structure for controlling a gain or gains of a first line and/or a second line by a distorted signal, the first line lying between an input end of the signal component separating device to the output end of the transmitter via the first power amplifier, and the second line lying between the input end of the signal component separating device and the output end of the transmitter via the second power amplifier,
  whereby ACLP components contained in the transmitter output are reduced to a predetermined level.

9. The composite transmitter according to claim 4, further comprising:
  a structure for forming a bifurcated signal extracted from an output signal of the transmitter;
  a structure for forming a distorted signal by orthogonally demodulating the bifurcated signal and canceling out the in-phase signal I and/or the orthogonal signal Q of the main signal;
  a structure for controlling a gain or gains of a first line and/or a second line by the distorted signal, the first line lying between an input end of the signal component separating device to the output end of the transmitter via the first power amplifier, and the second line lying between the input end of the signal component separating device and the output end of the transmitter via the second power amplifier,
  whereby ACLP components contained in the transmitter output are reduced to a predetermined level.

10. The composite transmitter according to claim 5, further comprising:
  a structure for forming a bifurcated signal extracted from an output signal of the transmitter;
  a structure for forming a distorted signal by orthogonally demodulating the bifurcated signal and canceling out the in-phase signal I and/or the orthogonal signal Q of the main signal;
  a structure for controlling a gain or gains of a first line and/or a second line by the distorted signal, the first line lying between an input end of the signal component separating device to the output end of the transmitter via the first power amplifier, and the second line lying between the input end of the signal component separating device and the output end of the transmitter via the second power amplifier,
  whereby ACLP components contained in the transmitter output are reduced to a predetermined level.

11. The composite transmitter according to claim 6, further comprising:
  a structure for forming a bifurcated signal extracted from an output signal of the transmitter;
  a structure for forming a distorted signal by orthogonally demodulating the bifurcated signal and canceling out the in-phase signal I and/or the orthogonal signal Q of the main signal;
  a structure for controlling a gain or gains of a first line and/or a second line by the distorted signal, the first line lying between an input end of the signal component separating device to the output end of the transmitter via the first power amplifier, and the second line lying between the input end of the signal component separating device and the output end of the transmitter via the second power amplifier,
  whereby ACLP components contained in the transmitter output are reduced to a predetermined level.

* * * * *